US011688326B2

(12) United States Patent
Feng et al.

(10) Patent No.: US 11,688,326 B2
(45) Date of Patent: Jun. 27, 2023

(54) SHIFT REGISTER, GATE DRIVING CIRCUIT, DISPLAY APPARATUS AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/844,899

(22) Filed: Jun. 21, 2022

(65) Prior Publication Data
US 2022/0319393 A1 Oct. 6, 2022

Related U.S. Application Data

(63) Continuation of application No. 16/478,366, filed as application No. PCT/CN2018/122801 on Dec. 21, 2018, now Pat. No. 11,475,824.

(30) Foreign Application Priority Data

Feb. 14, 2018 (CN) .......................... 201810151627.5

(51) Int. Cl.
*G09G 3/3266* (2016.01)
*G09G 3/20* (2006.01)
*G11C 19/28* (2006.01)

(52) U.S. Cl.
CPC ........... *G09G 3/2092* (2013.01); *G11C 19/28* (2013.01); *G09G 2300/0426* (2013.01);
(Continued)

(58) Field of Classification Search
CPC ......... G09G 3/2092; G09G 2300/0426; G09G 2310/0286; G09G 2310/061;
(Continued)

(56) References Cited

U.S. PATENT DOCUMENTS 8,698,722 B2 * 4/2014 Baek .................. H03K 5/15093
345/100
10,170,069 B2 * 1/2019 Xue ..................... G09G 3/3677
(Continued)

FOREIGN PATENT DOCUMENTS

CN 1183604 A 6/1998
CN 101093647 A 12/2007
(Continued)

OTHER PUBLICATIONS

Mar. 17, 2020—(CN) First Office Action Appl 201810151876.4 with English Translation.
(Continued)

*Primary Examiner* — Jose R Soto Lopez
(74) *Attorney, Agent, or Firm* — Banner & Witcoff, Ltd.

(57) ABSTRACT

Disclosed is a shift register including a first input sub-circuit, configured to receive a first input signal from a first input terminal and output a blanking output control signal to a first node in a blanking period of time of a frame; a second input sub-circuit, configured to receive a second input signal from a second input terminal and output a display output control signal to the first node in a display period of time of the frame; an output sub-circuit, configured to output a composite output signal via an output terminal under control of the first node, the composite output signal including a display output signal outputted in a display period of time and a blanking output signal outputted in a blanking period of time which are independent of each other.

17 Claims, 21 Drawing Sheets

(52) U.S. Cl.
CPC ............... *G09G 2310/0286* (2013.01); *G09G 2310/061* (2013.01); *G09G 2310/08* (2013.01)

(58) Field of Classification Search
CPC ............ G09G 2310/08; G09G 3/3674; G09G 2310/06; G09G 3/20; G09G 3/3266; G11C 19/28
See application file for complete search history.

(56) References Cited

U.S. PATENT DOCUMENTS

| | | | |
|---|---|---|---|
| 10,181,279 B2 | 1/2019 | Shim et al. | |
| 10,210,835 B2 | 2/2019 | Han et al. | |
| 10,216,319 B2 | 2/2019 | Cho et al. | |
| 10,297,204 B2 | 5/2019 | Gu et al. | |
| 10,475,362 B2 | 11/2019 | Wang | |
| 10,546,536 B2* | 1/2020 | Kim | G09G 3/3266 |
| 10,643,729 B2 | 5/2020 | Gu et al. | |
| 10,950,196 B2 | 3/2021 | Du et al. | |
| 2011/0222645 A1* | 9/2011 | Tobita | G09G 3/3677 377/77 |
| 2011/0291712 A1* | 12/2011 | Tobita | H03K 5/135 327/144 |
| 2012/0076256 A1 | 3/2012 | Yonemaru et al. | |
| 2014/0085176 A1* | 3/2014 | Kang | G11C 19/28 |
| 2014/0185737 A1* | 7/2014 | Jang | G09G 3/3266 377/64 |
| 2014/0241488 A1 | 8/2014 | Jang | |
| 2015/0015562 A1* | 1/2015 | Han | G09G 3/3266 345/212 |
| 2015/0030116 A1* | 1/2015 | Horiuchi | G09G 3/3677 377/67 |
| 2015/0036784 A1 | 2/2015 | Qing et al. | |
| 2016/0225307 A1* | 8/2016 | Yoon | G09G 3/2092 |
| 2016/0240144 A1* | 8/2016 | Song | G09G 3/3266 |
| 2016/0247446 A1 | 8/2016 | Cao et al. | |
| 2016/0351160 A1* | 12/2016 | In | G09G 3/3225 |
| 2017/0039950 A1* | 2/2017 | Li | G11C 19/28 |
| 2017/0140703 A1 | 5/2017 | Nishikawa et al. | |
| 2017/0178584 A1 | 6/2017 | Ma et al. | |
| 2017/0213499 A1* | 7/2017 | Kong | G11C 19/28 |
| 2018/0096733 A1* | 4/2018 | Kim | G09G 3/20 |
| 2018/0113564 A1* | 4/2018 | Takahashi | G06F 3/0446 |
| 2018/0137808 A1* | 5/2018 | Na | G09G 3/3233 |
| 2018/0138256 A1 | 5/2018 | Han et al. | |
| 2018/0204521 A1 | 7/2018 | Gu et al. | |
| 2018/0277043 A1 | 9/2018 | Li et al. | |
| 2018/0299988 A1* | 10/2018 | Chen | G09G 3/20 |
| 2018/0301100 A1 | 10/2018 | Li et al. | |
| 2018/0301101 A1 | 10/2018 | Hu et al. | |
| 2018/0337682 A1* | 11/2018 | Takasugi | H03K 21/18 |
| 2019/0244578 A1* | 8/2019 | Wu | G06F 3/0416 |
| 2020/0357352 A1* | 11/2020 | Du | G09G 3/3696 |
| 2021/0335197 A1 | 10/2021 | Feng et al. | |

FOREIGN PATENT DOCUMENTS

| | | | |
|---|---|---|---|
| CN | 101650909 A | 2/2010 | |
| CN | 102804280 A | 11/2012 | |
| CN | 103915058 A | 7/2014 | |
| CN | 104898891 A | 9/2015 | |
| CN | 104900211 A | 9/2015 | |
| CN | 105185294 A | 12/2015 | |
| CN | 105427825 A | 3/2016 | |
| CN | 105427829 A | 3/2016 | |
| CN | 105679229 A | 6/2016 | |
| CN | 105845060 A | 8/2016 | |
| CN | 105976787 A | 9/2016 | |
| CN | 106023943 A | 10/2016 | |
| CN | 106128384 A | 11/2016 | |
| CN | 106297888 A | 1/2017 | |
| CN | 106356015 A | 1/2017 | |
| CN | 106652933 A | 5/2017 | |
| CN | 106847225 A | 6/2017 | |
| CN | 106952601 A | 7/2017 | |
| CN | 106952610 A | 7/2017 | |
| CN | 106959775 A | 7/2017 | |
| CN | 107039017 A | 8/2017 | |
| CN | 107068088 A | 8/2017 | |
| CN | 107134268 A | 9/2017 | |
| CN | 105427829 B | 10/2017 | |
| CN | 107578741 A | 1/2018 | |
| CN | 108648716 A | 10/2018 | |
| CN | 108682397 A | 10/2018 | |
| CN | 108806611 A | 11/2018 | |
| KR | 20040070537 A | 8/2004 | |
| KR | 20160068081 A | 6/2016 | |
| KR | 20170078978 A | 7/2017 | |

OTHER PUBLICATIONS

Mar. 29, 2019—(CN) International Search Report Appn PCT/CN2018/123947 with English Translation.

Mar. 31, 2020—(CN) Office Action Appn 201810552885.4 with English Translation.

Feb. 26, 2021—(IN) Office Action Appn 201947052310.

Mar. 31, 2021—(US) Ex Parte Quayle Action Appn U.S. Appl. No. 16/618,300.

Sep. 16, 2021—(EP) Extended European Search Report Appn 18899019.6.

Oct. 12, 2021—(EP) Extended European Search Report Appn 18899020.4.

Nov. 12, 2021—(US) Non-Final Office Action Appn U.S. Appl. No. 16/478,395.

Mar. 25, 2022—(EP) Partial Supplementary European Search Report Appn 18906612.9.

Mar. 27, 2019—(CN) International Search Report Appn PCT/CN2018/122801.

Mar. 27, 2019—(CN) Written Opinion Appn PCT/CN2018/122801.

Oct. 5, 2021—(US) Non-Final Office Action Appn U.S. Appl. No. 16/478,336.

Aug. 1, 2022—(EP) Extended European Search Report Appn 18906612.9.

Dec. 21, 2022—(US) Non-Final Office Action U.S. Appl. No. 17/880,790.

* cited by examiner

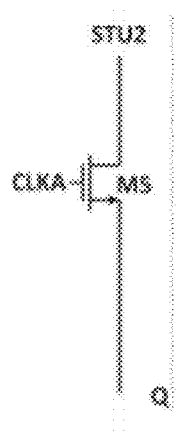 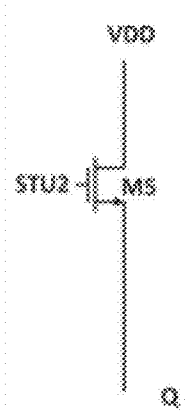
Fig.3a   Fig.3b
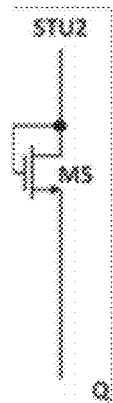 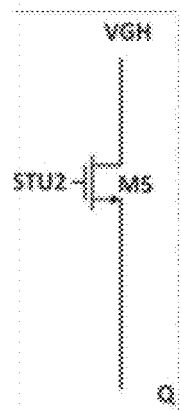
Fig.3c   Fig.3d
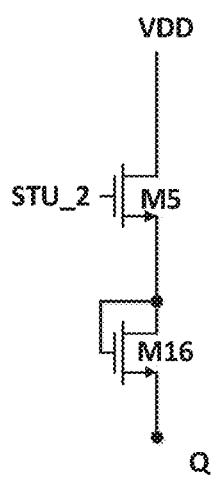
Fig. 3e

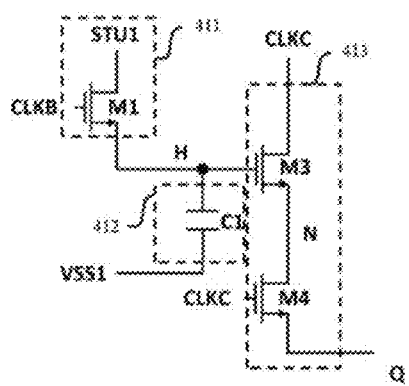
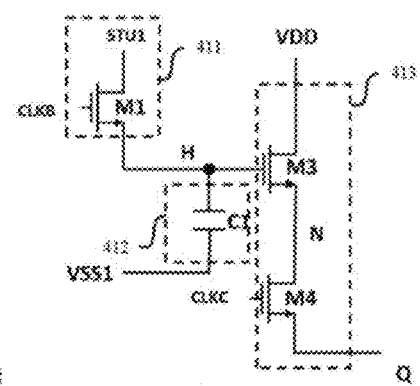
Fig.6a    Fig.6b
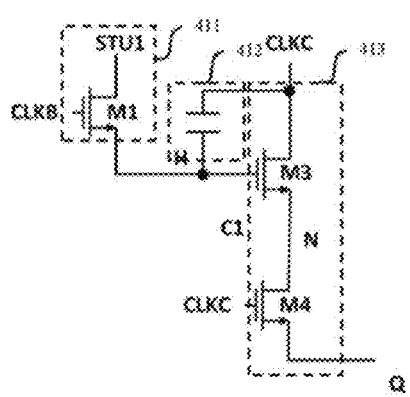
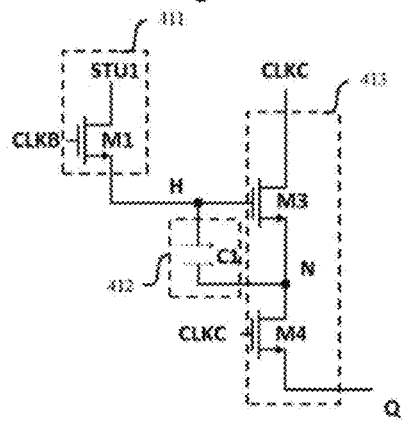
Fig.6c    Fig.6d
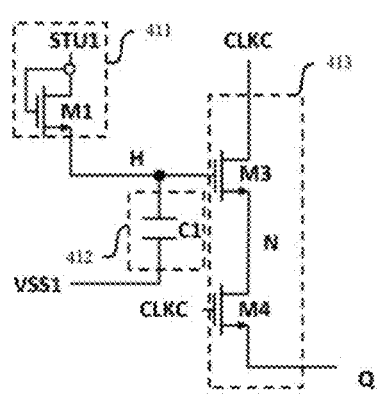
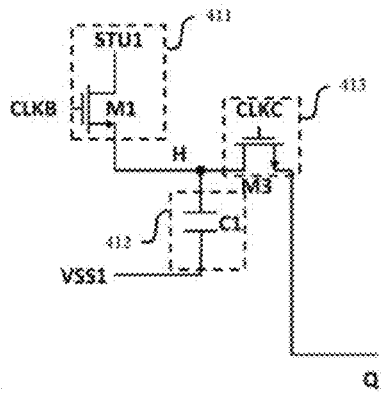
Fig.6e    Fig.6f

SHIFT REGISTER, GATE DRIVING CIRCUIT, DISPLAY APPARATUS AND DRIVING METHOD

CROSS-REFERENCE TO RELATED APPLICATION

This application is a continuation of U.S. Ser. No. 16/478,366 filed on Jul. 16, 2019 which is a national stage application of International Application No. PCT/CN2018/122801 filed on Dec. 21, 2018, which claims priority to Chinese Patent Application No. 201810151627.5 filed on Feb. 14, 2018, the contents of all these applications are incorporated by reference herein in their entirety.

TECHNICAL FIELD

The present disclosure relates to a shift register, a gate driving circuit comprising the shift register, a display apparatus and a driving method applicable to the shift register.

BACKGROUND

In display field, particularly in organic light-emitting diode OLED display, a gate driving circuit is currently integrated in a gate integrated circuit (GATE IC). Area of a chip in the integrated circuit IC design is a major factor that influences the cost of the chip. Thus, it needs to be considered emphatically by technical developers how to reduce the area of the chip efficiently.

The current OLED gate driving circuit is always formed by a combination of three sub-circuits, i.e., a sense unit, a scan unit and a connection unit (or gate circuit or Hiz circuit) that outputs a complex pulse of both. The structure of such circuit is very complicated, and cannot satisfy the requirement for high resolution and narrow bezel.

SUMMARY

The present disclosure provides a shift register, a gate driving circuit, a display apparatus and a driving method.

According to an aspect of the present disclosure, it is provided a shift register comprising: a first input sub-circuit, configured to receive a first input signal from a first input terminal and output a blanking output control signal; a second input sub-circuit, configured to receive a second input signal from a second input terminal and output a display output control signal; an output sub-circuit, configured to output a composite output signal via an output terminal under control of a first node, the composite output signal including a display output signal outputted in a display period of time and a blanking output signal outputted in a blanking period of time which are independent of each other.

In some embodiments, the first input sub-circuit is configured to receive the first input signal from the first input terminal, and input the blanking output control signal to the first node in a blanking period of time of a frame according to the first input signal; the second input sub-circuit is configured to receive the second input signal from the second input terminal, and input the display output control signal to the first node in a display period of the frame according to the second input signal.

In some embodiments, the first input sub-circuit comprises: a charging sub-circuit, configured to input the first input signal to a blanking pull-up control node according to the first input signal; a storing sub-circuit, having a first terminal connected to the blanking pull-up control node, configured to store a blanking pull-up control signal according to the first input signal; an isolating sub-circuit, configured to input the blanking output control signal to the first node according to the blanking pull-up control signal in the blanking period of time of the frame.

In some embodiments, the shift register further comprises a display reset sub-circuit, configured to reset the first node under control of a display reset control signal.

In some embodiments, the shift register further comprises a blanking reset sub-circuit, configured to reset the first node and/or the output terminal under control of a blanking reset control signal before the end of the blanking period of time of the frame.

In some embodiments, the output sub-circuit comprises at least one shift signal output terminal and at least one pixel signal output terminal.

In some embodiments, the shift register further comprises a pull-down control sub-circuit, configured to control a potential of a pull-down node according to the first node; a pull-down sub-circuit, configured to pull down the first node and the output terminal to a non-operating potential under control of the pull-down node.

In some embodiments, the charging sub-circuit comprises a charging transistor, having a first electrode and/or a control electrode connected to the first input terminal, and a second electrode connected to the blanking pull-up control node; and the storing sub-circuit comprises a first capacitor, having a first terminal connected to the blanking pull-up control node; and the isolating sub-circuit comprises a first isolation transistor and a second isolation transistor, wherein a control terminal of the first isolating transistor is connected to the blanking pull-up control node, a first electrode of the second isolating transistor is connected to a second electrode of the first isolating transistor, a second electrode of the second isolating transistor is connected to the first node, and a control electrode of the second isolating transistor is connected to an isolation control signal line.

In some embodiments, the second input sub-circuit comprises a first display input transistor, having a first electrode connected to the first node, a second electrode and/or a control electrode connected to the second input terminal; the output sub-circuit comprises an output transistor and an output capacitor, wherein a first electrode of the output transistor is connected to an output clock signal line, a second electrode of the output transistor is connected to the output terminal, and a control electrode of the output transistor is connected to the first node; a first terminal of the output capacitor is connected to the first node, and a second terminal of the output capacitor is connected to the output terminal.

In some embodiments, the second input sub-circuit further comprises a second display input transistor, having a first electrode connected with a control electrode of the second display input transistor and connected to the first electrode of the first display input transistor, and a second electrode connected to the first node.

In some embodiments, the display reset sub-circuit comprises a display reset transistor, having a first electrode connected to the first node, a control electrode connected to a display reset control terminal, and a second electrode connected to a display reset signal line.

In some embodiments, the blanking reset sub-circuit comprises a first blanking reset transistor, having a first electrode is connected to the first node, a control electrode connected to a blanking reset control terminal, and a second electrode connected to a blanking reset signal line.

In some embodiments, the blanking reset sub-circuit further comprises a second blanking reset transistor, having a first electrode connected to the output terminal, a control electrode connected to the blanking reset control terminal, and a second electrode connected to the blanking reset signal line.

In some embodiments, the pull-down control sub-circuit comprises a first pull-down control transistor and a second pull-down control transistor, wherein a first electrode of the first pull-down control transistor is connected with a control electrode of the first pull-down control transistor and connected to a pull-down control signal line, and a second electrode of the first pull-down control transistor is connected to the pull-down node; a first electrode of the second pull-down control transistor is connected to the pull-down node, a control electrode of the second pull-down control transistor is connected to the first node, and a second electrode of the second pull-down control transistor is connected to a pull-down signal line; the pull-down sub-circuit comprises a first pull-down transistor and a second pull-down transistor, wherein a first electrode of the first pull-down transistor is connected to the first node, a control electrode of the first pull-down transistor is connected to the pull-down node, and a second electrode of the first pull-down transistor is connected to the pull-down signal line; a first electrode of the second pull-down transistor is connected to the output terminal, a control electrode of the second pull-down transistor is connected to the pull-down node, and a second electrode of the second pull-down transistor is connected to the pull-down signal line.

In some embodiments, the shift register further comprises an electric leakage prevention sub-circuit, configured to input an operating potential to the first electrode and/or the second electrode of the second isolating transistor under control of the first node and/or the blanking pull-up control node.

According to another aspect of the present disclosure, it is provided a gate driving circuit, comprising N stages of shift registers connected in cascades, the shift register being the shift register according to any one of claims 1 to 15, wherein a second input terminal and a first input terminal of an i-th stage of shift register are connected to an output terminal of an (i−1)-th stage of shift register, and an output terminal of the i-th stage of shift register is connected to a display reset terminal of the (i−1)-th stage shift register, where N is an integer greater than 2, 1<i≤N; a second input terminal of a first stage of shift register is connected to a display signal line, and a first input terminal of the first stage of shift register is connected to a blanking signal line; a display reset control terminal of an N-th stage of shift register is connected to a display reset signal line.

According to another aspect of the present disclosure, it is provided a display apparatus, characterized in that, the display apparatus comprises the above mentioned gate driving circuit.

According to another aspect of the present disclosure, it is provided a driving method applicable to the above mentioned shift register, comprising: an display period of time of the frame, including: in a first control phase, inputting, by a second input sub-circuit, a display output control signal to a first node; in a first output phase, outputting, by an output sub-circuit, a first output signal under control of the first node; an blanking period of time of the frame, including: in a second control phase, inputting, by a first input sub-circuit, a blanking output control signal to the first node; in a second output phase, outputting, by an output sub-circuit, a second output signal under control of the first node.

In some embodiments, the driving method further comprises in a display reset phase, resetting the first node under control of a display reset control signal.

In some embodiments, the driving method further comprises in a blanking reset phase, retting the first node under control of a blanking reset control signal.

According to the shift register provided by the present disclosure, it can be realized that functions of the sending unit, the scan unit and the connection unit are accomplished by one shifter register circuit, thus structure of the gate driving circuit is reduced.

BRIEF DESCRIPTION OF THE DRAWINGS

In order to describe the technical solution of embodiments of the present disclosure more clearly, accompany drawings needed to be used in description of the embodiments will be introduced simply. Obviously, the drawings described below are just some embodiments of the present disclosure. For those ordinary skilled in the art, other drawings may also be obtained according to these drawings, without paying any inventive labor. The following figures are not purposely drawn by scaling in proportion according to the actual dimensions, because the key point is to show the substance and spirit of the present disclosure.

FIG. 3a shows a first exemplary circuit structure of a display input sub-circuit according to some embodiments of the present disclosure;

FIG. 3b shows a second exemplary circuit structure of a display input sub-circuit according to some embodiments of the present disclosure;

FIG. 3c shows a third exemplary circuit structure of a display input sub-circuit according to some embodiments of the present disclosure;

FIG. 3d shows a fourth exemplary circuit structure of a display input sub-circuit according to some embodiments of the present disclosure;

FIG. 3e shows a fifth exemplary circuit structure of a display input sub-circuit according to some embodiments of the present disclosure;

FIG. 6a shows a first exemplary circuit structure of a blanking input sub-circuit according to some embodiments of the present disclosure;

FIG. 6b shows a second exemplary structure of a blanking input sub-circuit according to some embodiments of the present disclosure;

FIG. 6c shows a third exemplary circuit structure of a blanking input sub-circuit according to some embodiments of the present disclosure;

FIG. 6d shows a fourth exemplary circuit structure of a blanking input sub-circuit according to some embodiments of the present disclosure;

FIG. 6e shows a fifth exemplary circuit structure of a blanking input sub-circuit according to some embodiments of the present disclosure;

FIG. 6f shows a sixth exemplary circuit structure of a blanking input sub-circuit according to some embodiments of the present disclosure;

DETAILED DESCRIPTION

Figure 1:
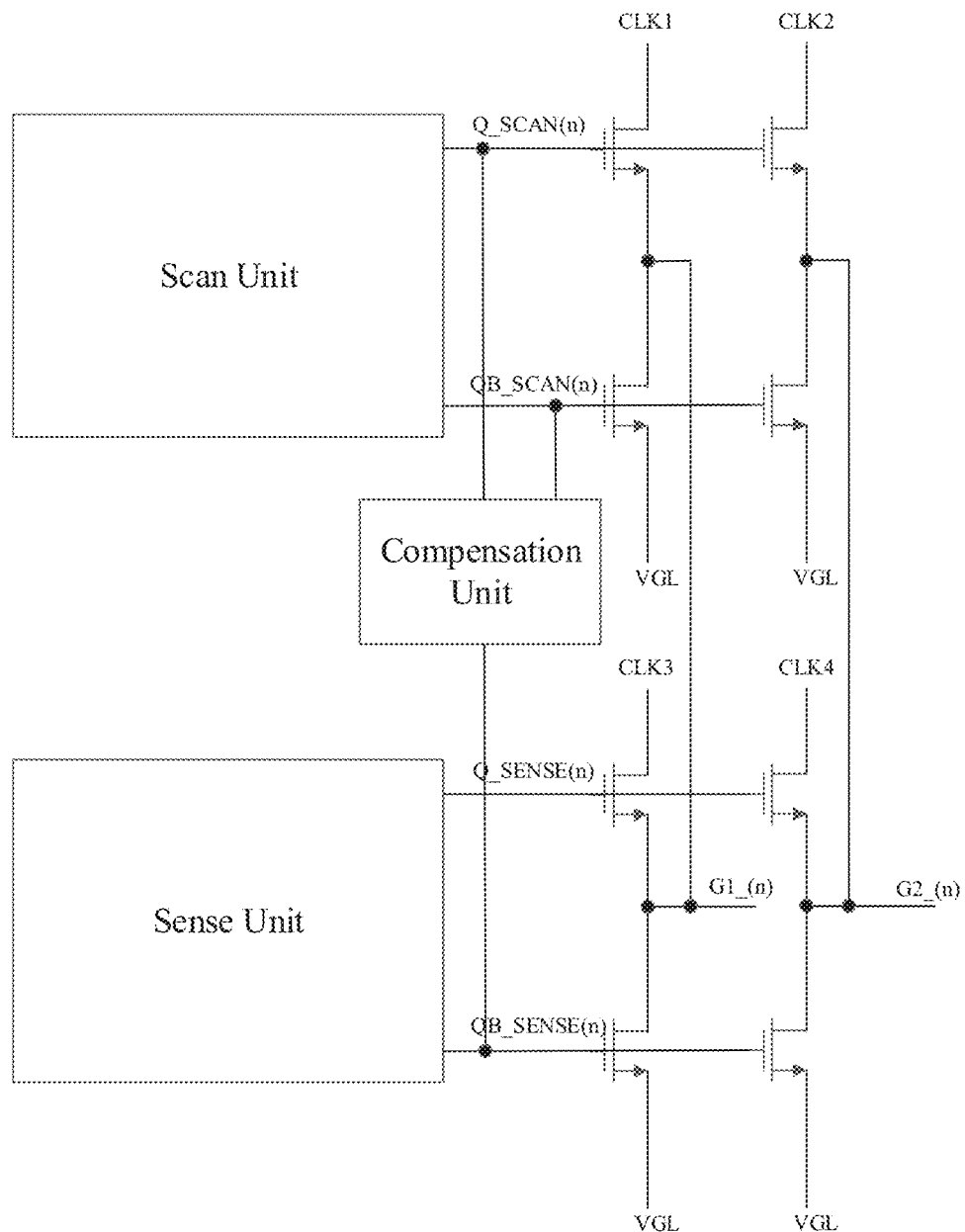
FIG. 1 shows a schematic block diagram of a structure of a shift register used for an OLED panel according to related art.

Technical solutions in embodiments of the present disclosure will be described below clearly and completely by combining with the drawings. The embodiments described herein are just a part of embodiments of the present disclosure, but not all the embodiments. Based on the embodiments of the present disclosure, all the other embodiments obtained by those ordinary skilled in the art without any inventive work also belong to the scope sought for protection in the present disclosure.

"First", "second" and similar words used in the present disclosure do not indicate any sequence, quantity or importance, but they are just used to distinguish different components. Also, "include", "comprise" and other similar words mean that an element or an object appearing prior to the word contains an element or an object or its equivalent listed subsequent to the word, but does not exclude other elements or objects. "Connect", "connected to" and other similar words are not limited to physical or mechanical connection, but may comprise electrical connection, regardless of direct connection or indirect connection. "Up", "down", "left", "right" and so on are only used to indicate a relative position relationship. After an absolute position of a described object is changed, the relative position relationship is likely to be changed correspondingly.

As disclosed in the specification and Claims of the present disclosure, unless otherwise explicitly indicating an exception in the context, "a", "one", "a kind of" and/or "the" and so on do not specifically refer to a singular number, but may also comprise a complex number. Generally speaking, terms of "include" and "comprise" only indicate to comprise those explicitly identified elements and steps, while these steps and elements do not form an exclusive list, and a method or a device is also likely to comprise other steps or elements.

Transistors adopted in all the embodiments of the present disclosure may be thin film transistors or field effect transistors or other devices having the same characteristics. In the present embodiment, connection manners of a drain and a source of each transistor may be exchanged with each other. Therefore, drains and sources of respective transistors in the embodiment of the present disclosure do not make any distinction. Herein, in order to distinct the two electrodes except the gate of the transistor, one electrode is called as a drain, and another electrode is called as a source. Thin film transistors adopted in the embodiment of the present disclosure may be N-type transistors, or may be P-type transistors. In the embodiment of the present disclosure, when the N-type thin film transistor is adopted, its first electrode may be a source, and second electrode may be a drain. The following embodiments are described by taking the thin film transistor being the N-type transistor as an example, that is, when the signal of the gate is a high level, the thin film transistor is turned on. It may be conceived that when the P-type transistor is adopted, it needs to adjust timings of driving signals correspondingly. Specific details are not described herein, but they shall be deemed as falling into the protection scope of the present disclosure.

FIG. 1 shows a schematic block diagram of a structure of a shift register used for an OLED panel according to the related art.

As shown in FIG. 1, the shift register used for the OLED panel in the related art is generally composed of three parts, i.e., a sense unit, a scan unit and a compensation unit, Herein, the sense unit and the scan unit comprise one set of output transistors, respectively. By utilizing the circuit structure of the above three parts, the shift register may output an output pulse with composite waveform, which is composed of two wave forms having different widths and timings.

However, in the existing shift register used for the OLED panel, since the output pulse of the composite waveform is realized by utilizing the sense unit and the scan unit respectively, the shift register has the disadvantage of oversize. In order to further reduce the size of the shift register and a gate driving circuit comprising the shift register, the shift register provided according to the embodiments of the present disclosure will be introduced below.

Figure 2:
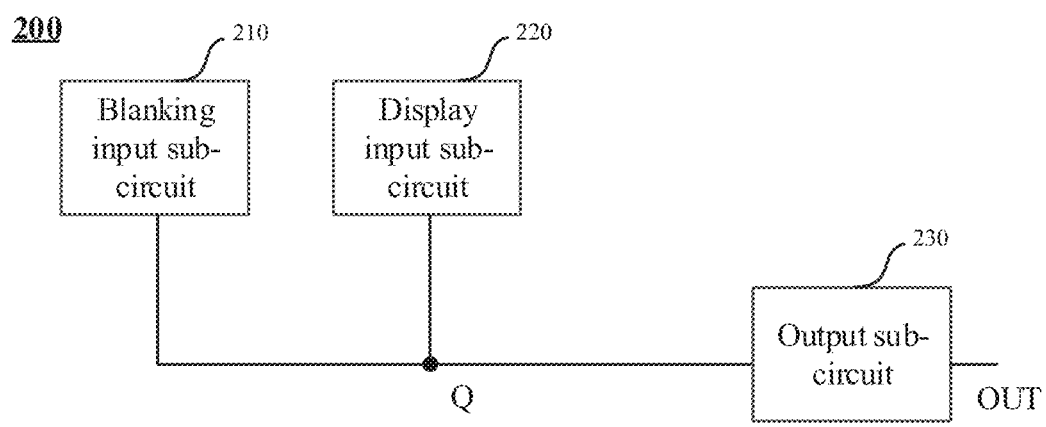
FIG. 2 shows a schematic block of a structure of a shift register according to some embodiments of the present disclosure.

FIG. 2 shows a schematic block diagram of a structure of a shift register according to some embodiments of the present disclosure. As shown in FIG. 2, a shift register 200 comprises a first input sub-circuit 210, a second input sub-circuit 220 and an output sub-circuit 230. Herein, the first input sub-circuit 210, the second input sub-circuit 220 and the output sub-circuit 230 are connected via a first node Q. Since the present disclosure is described by taking N type transistors as an example, in the present disclosure, the first node Q is also called as a first pull-up node Q. If the N type transistor in the present disclosure is replaced with a P type transistor, "pull-up node", "pull-up signal" mentioned in the present disclosure may also be referred to as "pull-down node", "pull-down signal". The first input sub-circuit is configured to receive a first input signal from a first input terminal, and input a blanking output control signal to the first node in a blanking period of time in a frame according to the first input signal. The second input sub-circuit is configured to receive a second input signal from a second input terminal, and input a display output control signal to the first node in a display period of time of a frame according to the second input signal.

In the present disclosure, the first input sub-circuit 210 is also called as a blanking input sub-circuit 210, and the second input sub-circuit 220 is also called as a display input sub-circuit 220 in the present disclosure.

"Blanking" in the blanking input sub-circuit in the present disclosure only indicates that this circuit is related to a blanking period of time, but it does not limit that this circuit operates only in the blanking period of time. Following respective embodiments are the same, and thus no further details are given. For example, the blanking input sub-circuit may charge a blanking pull-up control node H, which would be mentioned in the following text, in the display period of time, and keep the high level of the blanking pull-up control node H until the blanking period of time. The blanking input sub-circuit may charge the first pull-up node Q in the blanking period of time so that the first pull-up node Q becomes a high level.

In some embodiments, the blanking input sub-circuit 210 is configured to receive the first input signal (it is also referred to as "blanking input signal" in the following text) from the first input terminal (it is also referred to as "blanking input terminal" in the following text), and input a blanking output control signal (it is also referred to as "blanking pull-up signal" in the following text) to the first pull-up node Q in blanking period of time of a frame.

In some embodiments, the blanking input sub-circuit 210 may be configured to receive and store a blanking input signal, and output a blanking pull-up signal to the first pull-up node Q according to the blanking input signal in the blanking period of time of a frame, so as to pull up the potential of the first pull-up node Q to an operating potential.

For example, the blanking input sub-circuit 210 may receive the blanking input signal in the display period of time of a frame and store a blanking pull-up control signal according to the blanking input signal, and output a blanking pull-up signal to the first pull-up node Q according to the blanking pull-up control signal in the blanking period of time of a frame, so as to pull up the potential of the first pull-up node Q to the operating potential. For another example, the blanking input sub-circuit 210 may receive the blanking input signal and store the blanking pull-up control signal in the blanking period of time of a frame, and output the blanking pull-up signal to the first pull-up node Q according to the blanking pull-up control signal in a blanking period of time of a next frame, so as to pull up the potential of the first pull-up node Q to the operating potential.

In some embodiments, the display input sub-circuit 220 is configured to receive a second input signal (it is also referred to as "display input signal" in the following text) from a second input terminal (it is also referred to as "display input terminal" in the following text) in a display period of time of a frame, and input a display output control signal (it is also referred to as "display pull-up signal") to the first pull-up node Q, so as to pull up the potential of the first pull-up node Q to the operating potential.

The output sub-circuit 230 is configured to output a composite output signal via an output terminal under control of the first pull-up node Q. For example, the composite output signal may comprise a display output signal and a blanking output signal, wherein the display output signal and the blanking output signal may be two wave forms having different widths and timings and being independent from each other.

In some embodiments, in the display period of time of a frame, the output sub-circuit 230 is configured to output the display output signal via the output terminal under control of the first pull-up node Q. In the blanking period of time of a frame, the output sub-circuit 230 is configured to output the blanking output signal via the output terminal under control of the first pull-up node Q.

In the shift register according to the embodiment of the present disclosure, the blanking input sub-circuit configured to control the output sub-circuit to output the blanking output signal in the blanking period of time and the display input sub-circuit configured to control the output sub-circuit to output the display output signal in the display period of time may share a same pull-up node Q and a same output sub-circuit, so as to realize a shift register structure having a smaller size.

FIGS. 3a-3e show exemplary circuit structures of the display input sub-circuit 220 according to some embodiments of the present disclosure. As shown in FIGS. 3a-3e, the display input sub-circuit 220 may have a plurality of different connection structures and a plurality of different control methods may be applicable.

As shown in the figures, the display input sub-circuit 220 may comprise a display input transistor M5. As shown in FIG. 3a, a first electrode of the display input transistor M5 is connected to a display input terminal STU2, a second electrode of the display input transistor M5 is connected to the first pull-up node Q, and a control electrode of the display input transistor M5 is connected to a first clock signal line CLKA. In some embodiments, in the display period of time of a frame, under control of a first clock signal inputted by the first clock signal line CLKA, the display input transistor M5 would be turned on, and input a display input signal inputted by the display input terminal STU2 to the first pull-up node Q as a display pull-up signal.

As shown in FIGS. 3b and 3d, the first electrode of the display input transistor M5 may be connected to a high level signal line VDD/VGH, and is always inputted a turn-on signal of a high level, the second electrode of the display input transistor M5 is connected to the first pull-up node Q, and the control electrode of the display input transistor M5 is connected to the display input terminal STU2. In some embodiments, in the display period of time of a frame, under control of the display input signal inputted by the display input terminal STU2, the display input transistor M5 would be turned on, and input the high level signal inputted by the high level signal line VDD/VGH to the first pull-up node Q as a display pull-up signal.

For another example, as shown in FIG. 3c, the first electrode of the display input transistor M5 and the control electrode of the display input transistor M5 are connected with each other, and connected to the display input terminal STU2, and the second electrode of the display input transistor M5 is connected to the first pull-up node Q. In some embodiments, in the display period of time of a frame, under control of the display input signal of the display input terminal STU2, the display input transistor M5 would be turned on, and at the same time input the display input signal inputted by the display input signal line STU2 to the first pull-up node Q as the display pull-up signal.

The display sub-circuit 220 may further comprise a second display input transistor M16 connected between the display input transistor M5 and the first pull-up node Q. For example, as shown in FIG. 3e, a first electrode of the second display input transistor M16 and the control electrode of the second display input transistor M16 are connected with each other, and connected to the second electrode of the display input transistor M5, and a second electrode of the second display input transistor M16 is connected to the first pull-up node Q.

By utilizing the display input circuit as shown in FIG. 3e, when the display input transistor is turned on under control of the display input terminal, burrs may be prevented from being produced at the output terminal due to capacitive coupling in the circuit when a high level signal is inputted to the first pull-up node Q.

Figure 3F:
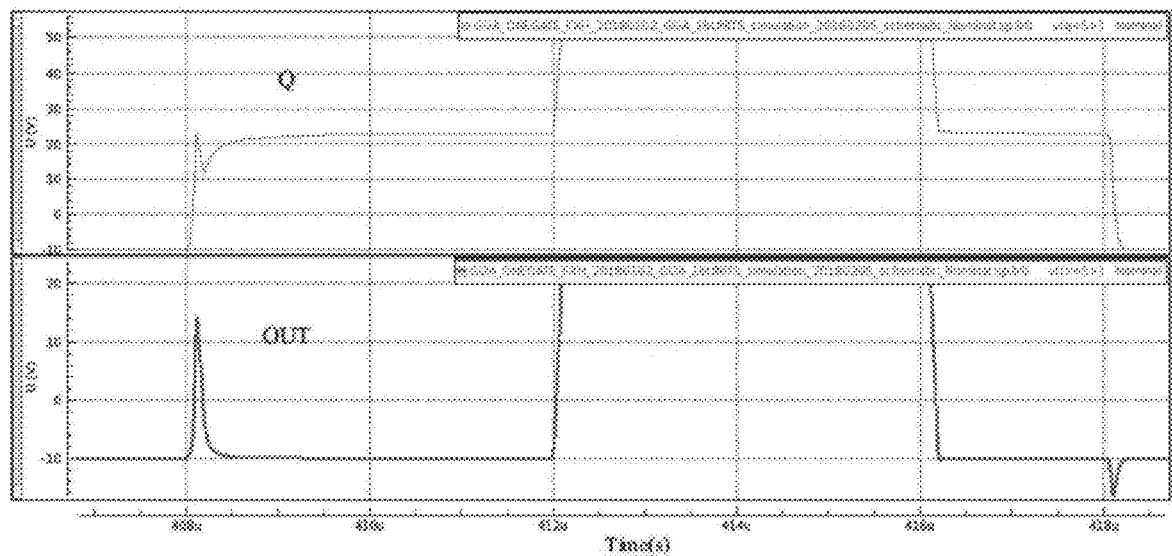
FIG. 3f shows a simulation schematic diagram of a potential at an output terminal OUT and a first pull-up node Q according to the related art.

FIG. 3f shows a simulation schematic diagram of the burrs produced at the output terminal. As described above, when the potential at the first pull-up node Q is pulled up to the high level by utilizing the high level signal line VDD in FIG. 3b, a large burr is likely to occur at the output terminal OUT due to the capacitive coupling in the circuit. Such burr is likely to cause the shift register to output a wrong output signal, thereby resulting that the shift register operates abnormally.

Figure 3G:
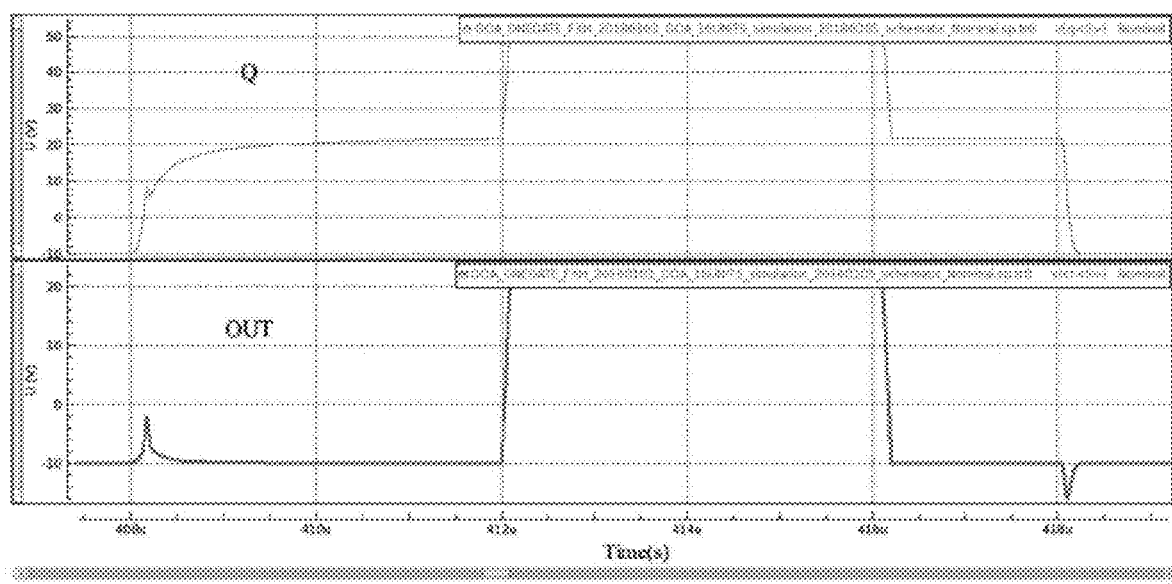
FIG. 3g shows a simulation schematic diagram of a potential at an output OUT and a first pull-up node Q according to some embodiments of the present disclosure.

FIG. 3g shows a simulation schematic diagram of an improved output terminal. If the display sub-circuit 220 further comprises the second display input transistor M16, the high level signal inputted by VDD does not pull up the first pull-up node Q directly, but realizes pulling up the potential of the first pull-up node Q via the second display input transistor M16 connected in series, so as to alleviate the coupling effect of capacitance in the circuit, and thus reduce the burr phenomenon at the output terminal OUT.

Figure 4A:
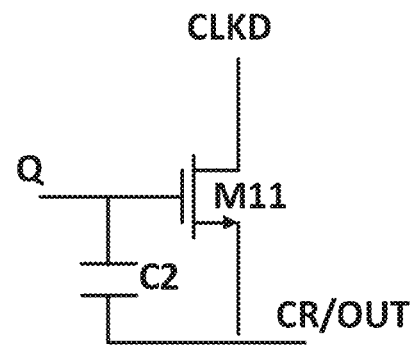
FIG. 4a shows a first exemplary circuit structure of an output sub-circuit according to some embodiments of the present disclosure.
Figure 4B:
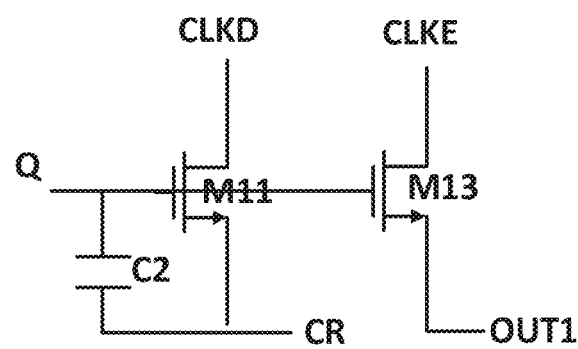
FIG. 4b shows a second exemplary circuit structure of an output sub-circuit according to some embodiments of the present disclosure.
Figure 4C:
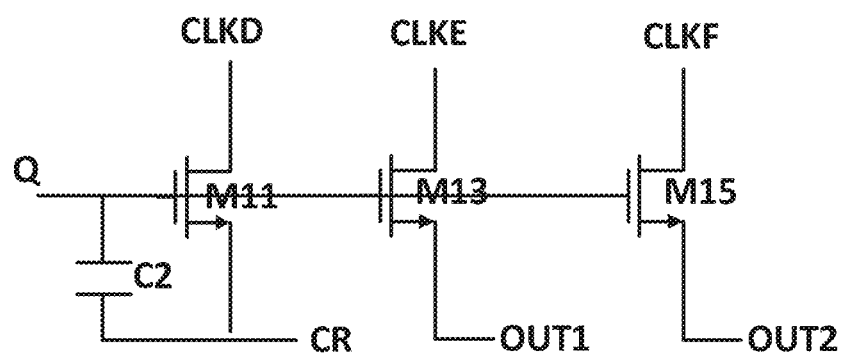
FIG. 4c shows a third exemplary circuit structure of an output sub-circuit according to some embodiments of the present disclosure.

FIGS. 4a-4c show an exemplary circuit structure of the output sub-circuit 230 according to some embodiments of the present disclosure.

As shown in FIG. 4a, the output sub-circuit 230 may comprise an output transistor M11 and an output capacitor C2. Herein, a first electrode of the output transistor M11 is connected to a fourth clock signal line CLKD, a second electrode of the output transistor M11 is connected to an output terminal CR/OUT, and a control electrode of the output transistor M11 is connected to the first pull-up node Q. A first terminal of the output capacitor is connected to the first pull-up node Q, and a second terminal of the output capacitor is connected to the output terminal CR/OUT. The output capacitor C2 is configured to store and maintain the potential of the first pull-up node Q. If the potential of the first pull-up node Q is maintained at a high level, the output transistor M11 is turned on under control of the first pull-up node Q, and outputs a signal inputted by the fourth clock signal line CLKD from the output terminal CR/OUT as an output signal. Herein, the signal outputted by the CR/OUT may be taken as a driving signal of a pixel circuit at the same time, and may also be taken as a shift driving signal of a gate driving circuit.

In some embodiments, in order to enhance driving capability of the shift register, the output sub-circuit 230 may further comprise two output terminals. For example, as shown in FIG. 4b, the output sub-circuit 230 may comprise a first output transistor M11 and a second output transistor M13. Herein, a first electrode of the first output transistor M11 is connected to the fourth clock signal line CLKD, a second electrode of the first output transistor M11 is connected to a first output terminal CR, and a control electrode of the first output transistor M11 is connected to the first pull-up node Q. A first electrode of the second output transistor M13 is connected to a fifth clock signal line CLKE, a second electrode of the second output transistor M13 is connected to a second output terminal OUT1, and a control electrode of the second output transistor M13 is connected to the first pull-up node Q. Herein, a signal outputted by the first output terminal CR may be used as the shift driving signal of the gate driving circuit, and a signal outputted by the second output terminal OUT1 may be used as a driving signal of a pixel circuit. Herein, the fourth clock signal line CLKD and the fifth clock signal line CLKE may be different clock signal lines, or may be the same clock signal line.

In some other embodiments, the output sub-circuit 230 may further comprise a plurality of output terminals. For example, as shown in FIG. 4c, the output sub-circuit 230 further comprises a third output transistor M15, having a first electrode connected to a sixth clock signal line CLKF, a second electrode connected to a third output terminal OUT2, and a control electrode connected to the first pull-up node Q. Herein, the sixth clock signal line CLKF may be a clock signal line the same as the fourth clock signal line CLKD and the fifth clock signal line CLKE, or may be a different clock signal line.

By utilizing the output sub-circuit as shown in FIG. 4c, two different driving signals may be provided to the pixel circuit, to increase flexibility of the driving mode of the pixel circuit. For example, as for a 3T1C type of pixel circuit, driving signals used for a scanning transistor and a sensing transistor may be provided respectively.

Although the above descriptions show examples of the shift register comprising one, two, three output terminals, those skilled in the art may understand that according to the principles of the present disclosure, more output terminals may be set according to the actual situation. The above examples shall not form a limitation to the protection scope of the present disclosure.

Figure 5:
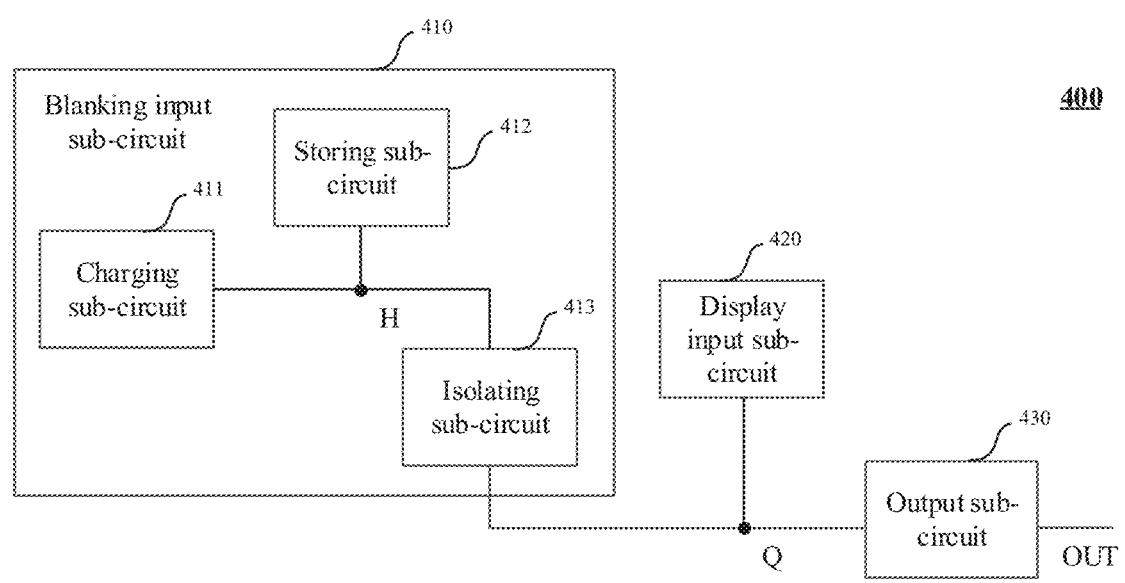
FIG. 5 shows a schematic block diagram of a structure of shift register according to some embodiments of the present disclosure.

FIG. 5 shows a schematic block diagram of another structure of a shift register according to some embodiments of the present disclosure. As shown in FIG. 5, a shift register 400 comprises a blanking input sub-circuit 410, a display input sub-circuit 420 and an output sub-circuit 430, of which the display input sub-circuit 420 and the output sub-circuit 430 may be the display input sub-circuit 220 and the output sub-circuit 230 as shown in FIGS. 2, 3a to 3g and modifications thereof, and thus no further details are given herein.

As shown in FIG. 5, the blanking input sub-circuit 410 may comprise a charging sub-circuit 411, a storing sub-circuit 412 and an isolating sub-circuit 413.

The charging sub-circuit 411 is configured to charge a blanking pull-up control node H according to the blanking input signal. In some embodiments, the charging sub-circuit 411 may receive the blanking input signal, and input the blanking pull-up control signal of a high level to the blanking pull-up control node H under control of the blanking input signal.

A terminal of the storing sub-circuit 412 is connected to the blanking pull-up control node H, and the storing sub-circuit 412 is configured to store the blanking pull-up control signal.

The isolating sub-circuit 413 is configured to input the blanking pull-up signal to the first pull-up node Q according to the blanking pull-up control signal in the blanking period of time of a frame. In some embodiments, the isolating sub-circuit 413 is disposed between the first pull-up node Q and the blanking pull-up control node H, and is used to prevent the first pull-up node Q and the blanking pull-up control node H from influencing each other. For example, when it is not necessary to output the blanking pull-up signal, the isolating sub-circuit 413 may disconnect the first pull-up node Q from the blanking pull-up control node H.

The shift register according to the embodiment of the present disclosure may realize controlling the first pull-up node Q through the blanking input sub-circuit and the display input sub-circuit in different periods of time respectively, so as to realize that the blanking input sub-circuit and the display input sub-circuit share a same output unit to realize outputting a composite output signal.

FIGS. 6a-6f show exemplary circuit structures of a blanking input sub-circuit according to some embodiments of the present disclosure. As shown in FIGS. 6a-6f, the blanking input sub-circuit 410 may have various different connection structures and a plurality of different control methods may be applicable.

The charging sub-circuit 411 may comprise a charging transistor M1, configured to charge the blanking pull-up control node H according to the blanking input signal. A first electrode and/or control electrode of the charging transistor M1 is connected to the blanking input terminal, and a second electrode of the charging transistor M1 is connected to the blanking pull-up control node.

In some embodiments, the charging sub-circuit 411 may be configured to input a blanking input signal to the blanking pull-up control node H. For example, as shown in FIG. 6a (or FIG. 6c, FIG. 6d, FIG. 6f), the first electrode of the charging transistor M1 is connected to a blanking input terminal STU1, the second electrode of the charging transistor M1 is connected to the blanking pull-up control node H, and the control electrode of the charging transistor M1 is connected to a second clock signal line CLKB. Herein, when the second clock signal line CLKB is inputted a turn-on signal of a high level, the charging transistor M1 is turned on under control of a second clock signal inputted by the second clock signal line CLKB, and inputs the blanking input signal inputted by the blanking input terminal STU1 to the blanking pull-up control node H. For another example, as shown in FIG. 6e, the control electrode of the charging transistor M1 is connected with the first electrode of the charging transistor M1, and is connected to the blanking input signal line STU1, and the second electrode of the charging transistor M1 is connected to the blanking pull-up control node H. Herein, when the blanking input terminal STU1 is inputted a turn-on signal of a high level, the charging transistor M1 is turned on under control of the turn-on signal, and inputs the blanking input signal inputted by the blanking input terminal STU1 to the blanking pull-up control node H.

In some other embodiments, the charging sub-circuit may be configured to input the blanking pull-up control signal of a high level to the blanking pull-up control node H under control of the blanking input signal. For example, the first electrode of the charging transistor M1 may be connected to a high level signal line VDD, the second electrode of the charging transistor M1 is connected to the blanking pull-up control node H, and the control electrode of the charging transistor M1 is connected to the blanking input terminal STU1. Herein, when the blanking input terminal STU1 is inputted a turn-on signal of a high level, the charging transistor M1 is turned on under control of the blanking input signal inputted by the blanking input terminal STU1, and inputs the high level signal inputted by VDD to the blanking pull-up control node H as the blanking pull-up control signal.

The storage sub-circuit 412 may comprise a first capacitor C1, configured to store the blanking pull-up control signal. A terminal of the first capacitor C1 is connected to the blanking pull-up control node H. As shown in FIG. 6a, a first terminal of the first capacitor C1 is connected to the blanking pull-up control node H, and a second terminal of the first capacitor C1 is connected to a first signal terminal VSS1. Herein, the VSS1 may be inputted a low level signal. As described above, when the charging sub-circuit inputs the blanking pull-up control signal to the blanking pull-up control node H, the first capacitor may be charged and the potential of the blanking pull-up control node H is maintained at a high level.

Also, the first capacitor C1 may have other connection modes. For example, as shown in FIG. 6C, the first terminal of the first capacitor is connected to the blanking pull-up control node H, and the second terminal of the first capacitor is connected to one terminal (such as a third clock signal line CLKC) of the isolating sub-circuit 413. For another example, as shown in FIG. 6d, the first terminal of the first capacitor C1 is connected to the blanking pull-up control node H, and the second terminal of the first capacitor is connected to one point (such as a connection point N of a first isolating transistor M3 and a second isolating transistor M4) in the isolating sub-circuit 413.

The isolating sub-circuit 413 may comprise the first isolating transistor M3 and the second isolating transistor M4. In some embodiments, the isolating sub-circuit 413 is configured to output the blanking pull-up signal to a first pull-up node Q under control of the blanking pull-up control node.

For example, as shown in FIG. 6a (or 6c, 6d, 6e), a first electrode of the first isolating transistor M3 is connected to a third clock signal line CLKC, a second electrode of the first isolating transistor M3 is connected to a first electrode of the second isolating transistor M4, and a control electrode of the first isolating transistor M3 is connected to the blanking pull-up control node H. A second electrode of the second isolating transistor M4 is connected to the first pull-up node Q, and a control electrode thereof is connected to the third clock signal line CLKC. If the blanking pull-up control node H is maintained at a high level under control of the storage sub-circuit, the first isolating transistor M3 is turned on under control of the blanking pull-up control node H. If the third clock signal line CLKC is inputted to a turn-on signal of a high level, the second isolating transistor M4 is turned on under control of the turn-on signal, and inputs the high level signal inputted by the third clock signal line CLKC to the first pull-up node Q as the blanking pull-up signal.

For another example, as shown in FIG. 6b, the first electrode of the first isolating transistor M3 may be connected to the high level signal line VDD. If the blanking pull-up control node H is maintained at a high level under control of the storage sub-circuit, the first isolating transistor M3 is turned on under control of the blanking pull-up control node H. If the third clock signal CLKC is inputted a turn-on signal of a high level, the second isolating transistor M4 is turned on under control of the turn-on signal, and inputs the high level signal inputted by the high level signal line VDD to the first pull-up node Q as the blanking pull-up signal.

In some embodiments, the isolating sub-circuit 413 is configured to output the high level signal stored at a blanking pull-up control node to the first pull-up node Q as the blanking pull-up signal.

For example, as shown in FIG. 6f, the isolating sub-circuit 413 comprises the first isolating transistor M3, having a first electrode connected to the blanking pull-up control node H, a second electrode connected to the first pull-up node Q, and a control electrode connected to the third clock signal line CLKC. If the third clock signal line CLKC is inputted a turn-on signal of a high level, the first isolating transistor M3 is turned on under control of the turn-on signal, and inputs a blanking pull-up control signal of a high level which is stored at the blanking pull-up control node H to the first pull-up node Q as the blanking pull-up signal.

As described above, the charging sub-circuit 411, the storing sub-circuit 412 and the isolating sub-circuit 413 may have a variety of different connection modes respectively. Although FIGS. 6a-6f show only six exemplary connection modes, those skilled in the art may understand that according to the principle of the present disclosure, various modifications of the charging sub-circuit 411, the storing sub-circuit 412 and the isolating sub-circuit 413 may be combined arbitrarily.

Figure 7:
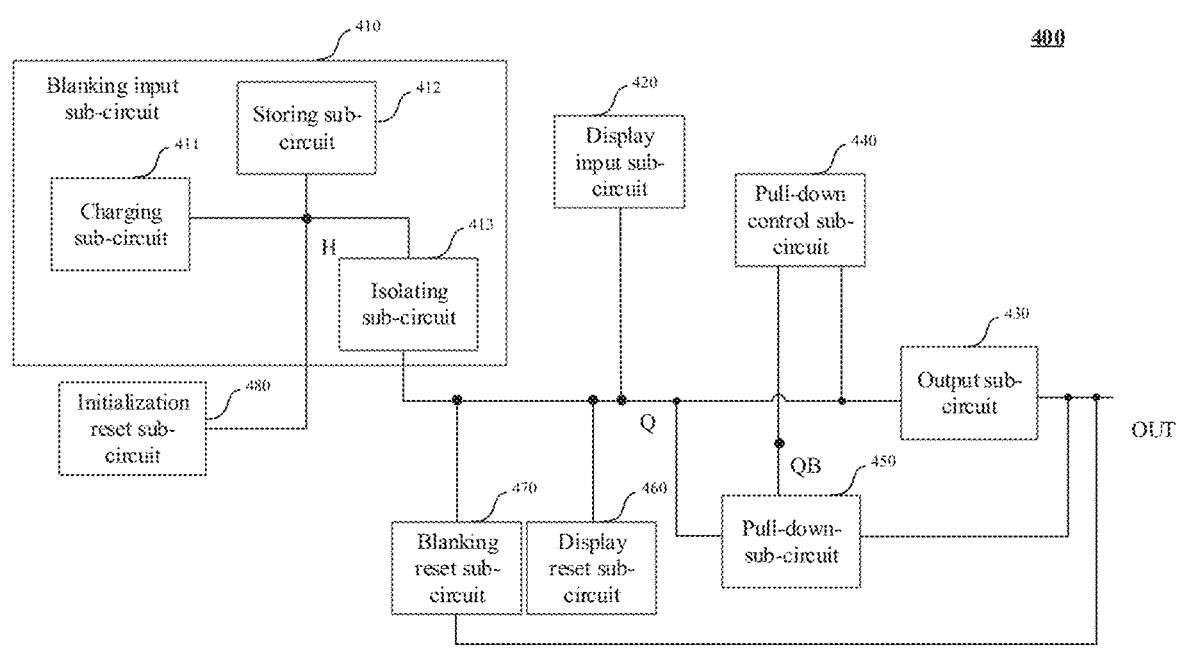
FIG. 7 shows another schematic block diagram of a structure of a shift register according to some embodiments of the present disclosure.

FIG. 7 shows a schematic block diagram of another structure of a shift register according to some embodiments of the present disclosure. As shown in FIG. 7, a shift register 400 may comprise a blanking input sub-circuit 410, a display input sub-circuit 420, an output sub-circuit 430, a pull-down control sub-circuit 440, a pull-down sub-circuit 450, a display reset sub-circuit 460, a blanking reset sub-circuit 470 and an initialization reset sub-circuit 480. Herein, the blanking input sub-circuit 410, the display input sub-circuit 420 and the output sub-circuit 430 may be the blanking input sub-circuit 210/310, the display input sub-circuit 220/320 and the output sub-circuit 230/330 as shown in FIGS. 2-5 and modifications thereof, and thus no further details are given herein.

As shown in FIG. 7, the shift register 400 may further comprise a pull-down control sub-circuit 440, configured to control a potential of a pull-down node QB under control of the first pull-up node Q. For example, if the potential of the first pull-up node Q is at a high level, the pull-down control sub-circuit 440 may pull down the pull-down node QB to a low level under the control of the first pull-up node Q. For another example, if the potential of the first pull-up node Q is at a low level, the pull-down control sub-circuit 440 may pull up the pull-down node QB to a high level under control of the first pull-up node Q.

The shift register 400 may further comprise a pull-down sub-circuit 450, configured to pull down the first pull-up node Q and the output terminal OUT to a non-operating potential under control of the pull-down node QB. For example, if the output terminal OUT does not output any signal, the first pull-up node Q and the output terminal OUT may be pulled down to the non-operating potential by controlling the potential of the pull-down node QB, so as to reduce the noise at the output terminal in the shift register circuit.

In some embodiments, the shift register 400 may further comprise a display reset sub-circuit 460, configured to reset the first pull-up node Q under control of a display reset control signal. In some embodiments, after the shift register 400 outputs a display output signal in the display period of time of a frame, before the display period of time ends up, the display reset control signal may be received by the display reset sub-circuit 460, so that the potential of the first pull-up node Q is pulled down to a low level.

In some embodiments, the shift register 400 may further comprise a blanking reset sub-circuit 470, configured to reset the first pull-up node Q and/or the output terminal OUT before the blanking period of time of a frame ends up. In some embodiments, after the shift register 400 outputs a blanking output signal in the blanking period of time of a frame, and before the blanking period of time ends up, the blanking reset control signal may be received via the blanking reset sub-circuit 470, so that the potential of the first pull-up node Q is pulled down to a low level. In some other embodiments, the potential of the output terminal OUT may also be pulled down to a low level by the blanking reset sub-circuit 470, so as to reduce the noise at the output terminal in the shift register circuit.

In some embodiments, the shift register 400 may further comprise an initialization reset sub-circuit 480, configured to receive an initialization reset control signal and reset the blanking pull-up control node H before the shift register 400 starts operating.

Those skilled in the art may understand that although the shift register in FIG. 7 shows the pull-down control sub-circuit 440, the pull-down sub-circuit 450, the display reset sub-circuit 460, the blanking reset sub-circuit 470 and the initialization reset sub-circuit 480. However, the above examples cannot limit the protection scope of the present disclosure. In actual application, technicians may select to use or not use one or more of the respective sub-circuits described above according to the actual conditions. Various combinations or modifications based on the respective sub-circuits described above do not depart from the principles of the present disclosure, and thus no further details are given herein.

The shift register provided according to the present disclosure may realize controlling the first pull-up node Q through the blanking input sub-circuit and the display input sub-circuit in different periods of time respectively, so as to realize that the blanking input sub-circuit and the display input sub-circuit share a same output unit, thereby realizing the output of the composite output signal. Furthermore, the noise of the shift register may be reduced by controlling potentials of the output terminal and the pull-up node in a non-output period of time.

Figure 8:
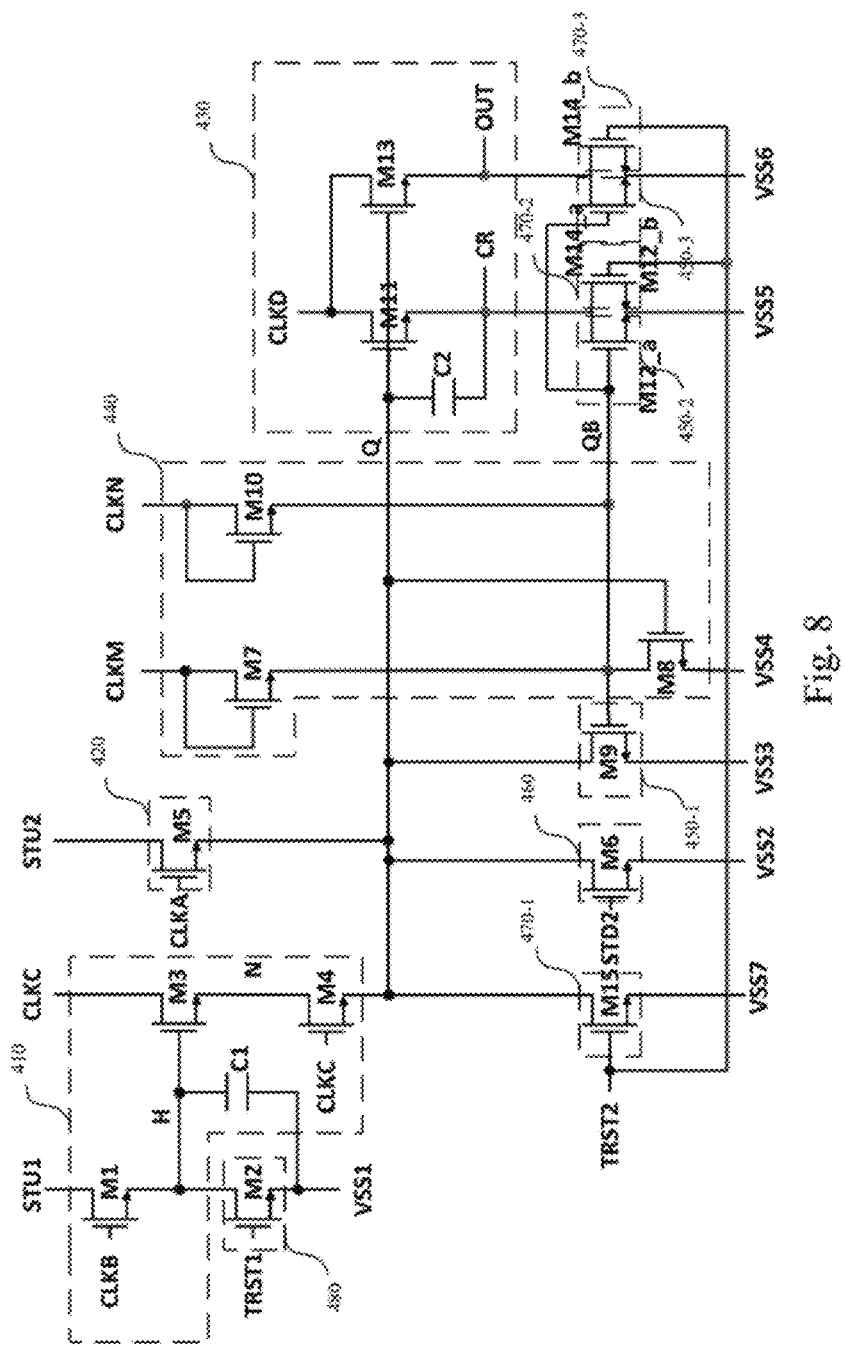
FIG. 8 shows a first exemplary circuit structure of a shift register according to some embodiments of the present disclosure.

FIG. 8 shows an exemplary circuit structure of a shift register according to some embodiments of the present disclosure. Herein, the blanking input sub-circuit 410, the display input sub-circuit 420 and the output sub-circuit 430 as shown in FIG. 8 are the same as the blanking input sub-circuit, the display input sub-circuit and the output sub-circuit as shown in FIGS. 2-5, and thus no further details are given herein.

As shown in FIG. 8, the pull-down control sub-circuit 440 may comprise a first pull-down control transistor M7, having a control electrode connected with a first electrode of the first pull-down control transistor M7 and connected to a seventh clock signal line CLKM, and a second electrode connected to a pull-down node QB. In the operation of the shift register 400, the seventh clock signal line CLKM may be always inputted a turn-on signal of a high level. The pull-down control sub-circuit 440 may further comprise a second pull-down control transistor M8, having a first electrode connected to the pull-down node QB, a second electrode connected to a fourth signal terminal VSS4, and a control electrode connected to the first pull-up node Q. Herein, the fourth signal terminal VSS4 may be inputted a turn-off signal of a low level. If the first pull-up node Q is at a high level, the second pull-down control transistor M8 would be turned on under control of the first pull-up node Q. The potential of the pull-down node QB may be pulled down to a low level by designing a channel width-to-length ratio of the first pull-down control transistor M7 and the second pull-down control transistor M8. If the first pull-up node Q is at a low level, the second pull-down control transistor M8 would be turned off under control of the first pull-up node Q. At this time, the high level signal inputted by the seventh clock signal line CLKM would be inputted to the pull-down node QB, and the potential of the pull-down node QB would be pulled up to the high level.

In the above embodiment, the seventh clock signal line CLKM is always inputted a high level signal in the operation of the shift register, and thus the first pull-down control transistor M7 is always in a turn-on state. In order to avoid performance drift caused by turning on the transistors for a long period of time, the pull-down control sub-circuit 440 may further comprise a third pull-down control transistor M10, having a control electrode connected with a first electrode of the third pull-down control transistor M10 and connected to an eighth clock signal line CLKN, and a second electrode connected to the pull-down node QB. It may be seen that structures of the third pull-down control transistor M10 and the first pull-down control transistor M7 are the same. In the operation process of the shift register, the third pull-down control transistor M10 and the first pull-down control transistor M7 may be used alternatively to realize functions of the pull-down control sub-circuit 440. For example, if the seventh clock signal line CLKM is inputted a high level signal, the eighth clock signal line CLKN is inputted a low level signal. Therefore, at this time, the first pull-down control transistor M7 is turned on, and the third pull-down control transistor M10 is turned off. If the seventh clock signal line CLKM is inputted a low level signal, the eighth clock signal line CLKN is inputted a high level signal, Therefore, at this time, the first pull-down control transistor M7 is turned off, and the third pull-down control transistor M10 is turned on.

As shown in FIG. 8, the pull-down sub-circuit 450 may comprise a first pull-down transistor M9, having a first electrode connected to the first pull-up node Q, a second electrode connected to a third signal line VSS3, and a control electrode connected to the pull-down node QB. Herein, the third signal line VSS3 may be inputted a turn-off signal of a low level. If the pull-down node QB is at a high level, the first pull-down transistor M9 would be turned on under control of the pull-down node QB, and pulls down the first pull-up node Q to a low level.

The pull-down sub-circuit 450 may further comprise a second pull-down transistor M12_a, having a first electrode connected to the first output terminal CR, a second electrode connected to a fifth signal line VSS5, and a control electrode connected to the pull-down node QB. Herein, the fifth signal line VSS5 may be inputted a turn-off signal of a low level.

If the pull-down node QB is at a high level, the second pull-down transistor M12_a would be turned on under control of the pull-down node QB, and pulls down the first output terminal CR to a low level.

If the output sub-circuit comprises a plurality of output terminals, the pull-down sub-circuit may correspondingly comprise more pull-down transistors. For example, as shown in FIG. 8, the pull-down sub-circuit 450 may further comprise a third pull-down transistor M14_a. A first electrode of the third pull-down transistor M14_a is connected to the second output terminal OUT, a second electrode of the third pull-down transistor M14_a is connected to a sixth signal line VSS6, and a control electrode of the third pull-down transistor M14_a is connected to the pull-down node QB. Herein, the sixth signal line VSS6 may be inputted a turn-off signal of a low level. If the pull-down node QB is at a high level, the third pull-down transistor M14_a would be turned on under control of the pull-down node QB, and pull down the second output terminal OUT to the low level respectively.

As shown in FIG. 8, the display reset sub-circuit 460 may comprise a display reset transistor M6, having a first electrode connected to the first pull-up node Q, a second electrode connected to the second signal line VSS2, and a control electrode connected to a display reset control terminal STD2. Herein, the second signal line VSS2 may be inputted a turn-off signal of a low level. In the display period of time of a frame, if the display reset control terminal STD2 is inputted a high level turn-on signal, the display reset transistor M6 would be turned on, and pulls down the first pull-up node Q to a low level.

As shown in FIG. 8, the blanking reset sub-circuit 470 may comprise a first blanking reset transistor M15, having a first electrode connected to the first pull-up node Q, a second electrode connected to a seventh signal line VSS7, and a control electrode connected to a blanking reset control terminal TRST2. Herein, the seventh signal line VSS7 may be inputted a turn-off signal of a low level. Before the blanking period of time of a frame ends up, the blanking reset control terminal TRST2 may be inputted a turn-on signal of a high level. At this time, the first blanking reset transistor M15 would be turned on, and pull down the first pull-up node Q to a low level.

In some embodiments, the blanking reset sub-circuit 470 may further comprise a second blanking reset transistor M12_b, having a first electrode connected to the first output terminal CR, a second electrode connected to a fifth signal line VSS5, and a control electrode connected to the blanking reset control terminal TRST2. If the blanking reset control terminal TRST2 is inputted a turn-on signal of a high level, the second blanking reset transistor M12_b would be turned on, and pull down the first output terminal CR to a low level.

If the output sub-circuit comprises a plurality of output terminals, the blanking reset sub-circuit 470 may further comprise more blanking reset transistors correspondingly. For example, as shown in FIG. 8, the blanking reset sub-circuit 470 may further comprise a third reset transistor M14_b, having a first electrode connected to the second output terminal OUT, a second electrode connected to the sixth signal line VSS6, and a control electrode connected to the blanking reset control terminal TRST2. If the blanking reset control terminal TRST2 is inputted a turn-on signal of a high level, the third blanking reset transistor M14_b would be turned on, and pull down the second output terminal OUT to the low level. Those skilled in the art may understand that if the output sub-circuit comprises more output terminals, the blanking reset sub-circuit 470 may comprise more blanking reset transistors corresponding to the output terminal for resetting the output terminal.

As shown in FIG. 8, the initialization reset sub-circuit 480 may comprise an initialization reset transistor M2, having a first terminal is connected to a blanking pull-up control node H, second electrode is connected to the first signal line VSS1, and control electrode is connected to an initialization reset control terminal TRST1. Herein, the first signal line VSS1 may be inputted a turn-off signal of a low level. If the initialization reset control terminal TRST1 is inputted a turn-on signal of a high level, the initialization reset transistor M2 would be turned on, and reset the blanking pull-up control node H.

It needs to be specified that the first signal line VSS1, the second signal line VSS2, the third signal line VSS3, the fourth signal line VSS4, the fifth signal line VSS5, the sixth signal line VSS6 and the seventh signal line VSS7 as shown in FIG. 8 may be a same signal line, or may be different signal lines. Only if the functions of the shift register and controlling modes of respective transistors in the shift register as described above may be realized, those skilled in the art may set the above signal line according to the actual conditions arbitrarily.

Figure 9:
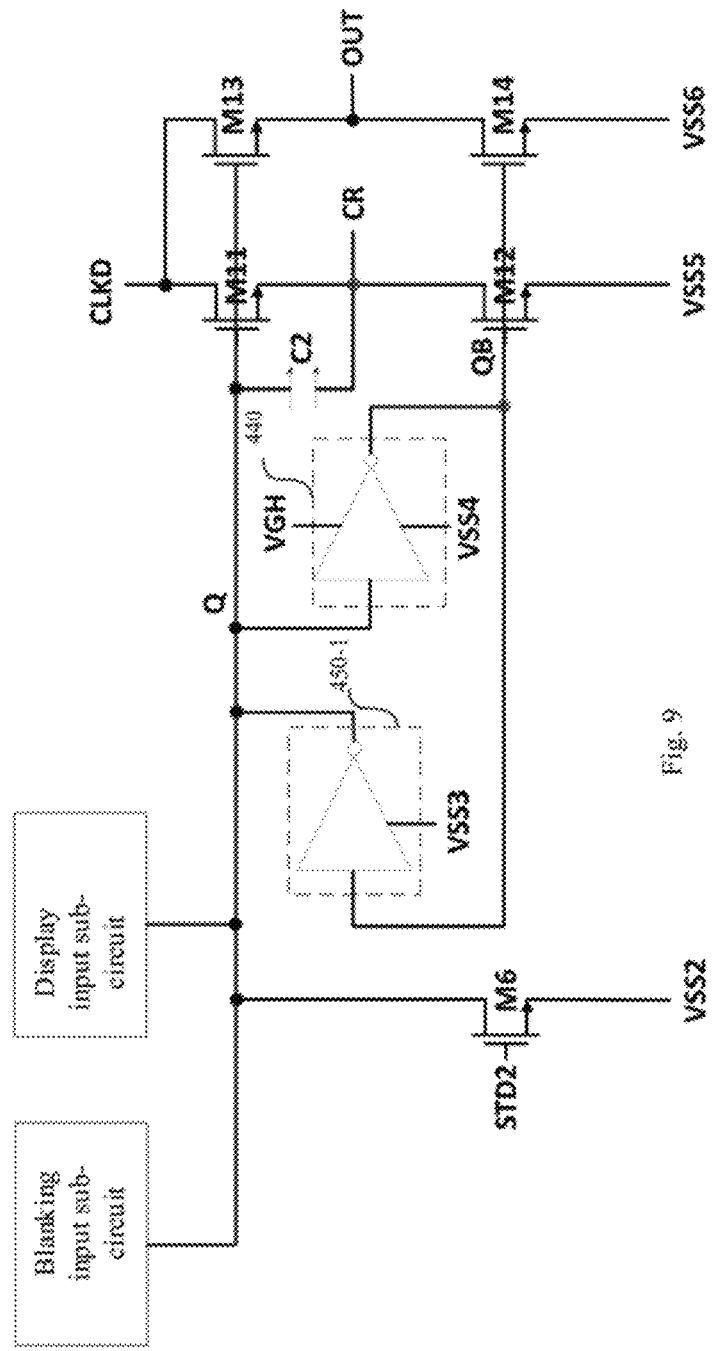
FIG. 9 shows a second exemplary circuit structure of a shift register according to some embodiments of the present disclosure.

FIG. 9 shows an exemplary circuit structure of a shift register according to some embodiments of the present disclosure. As shown in FIG. 9, the pull-down control sub-circuit 440 may be an inverter. An input terminal of the inverter is connected to the first pull-up node Q, and an output terminal of the inverter is connected to the pull-down node QB. If the first pull-up node Q is at a high level, the potential at the pull-down node QB may be controlled to be of a low level by utilizing the inverter. Similarly, a first part 450-1 of the pull-down sub-circuit may also be an inverter. If the pull-down node QB is at a high level, the potential at the first pull-up node Q may be controlled to be of a low level by utilizing the inverter.

In the shift register of the related art, since the performance of the OLED panel is unstable, it is necessary to utilize an external compensation algorithm, and in a detection phase of the gate driving circuit in the external compensation circuit, the node Q of the control electrode of the output transistor needs to be maintained at a high level for a time of more than one frame. However, since TFT is at a negative bias voltage, negative drift is likely to occur to the threshold voltage and electric leakage may occur when the node Q is at a high level, such that the output becomes abnormal.

Figure 10:
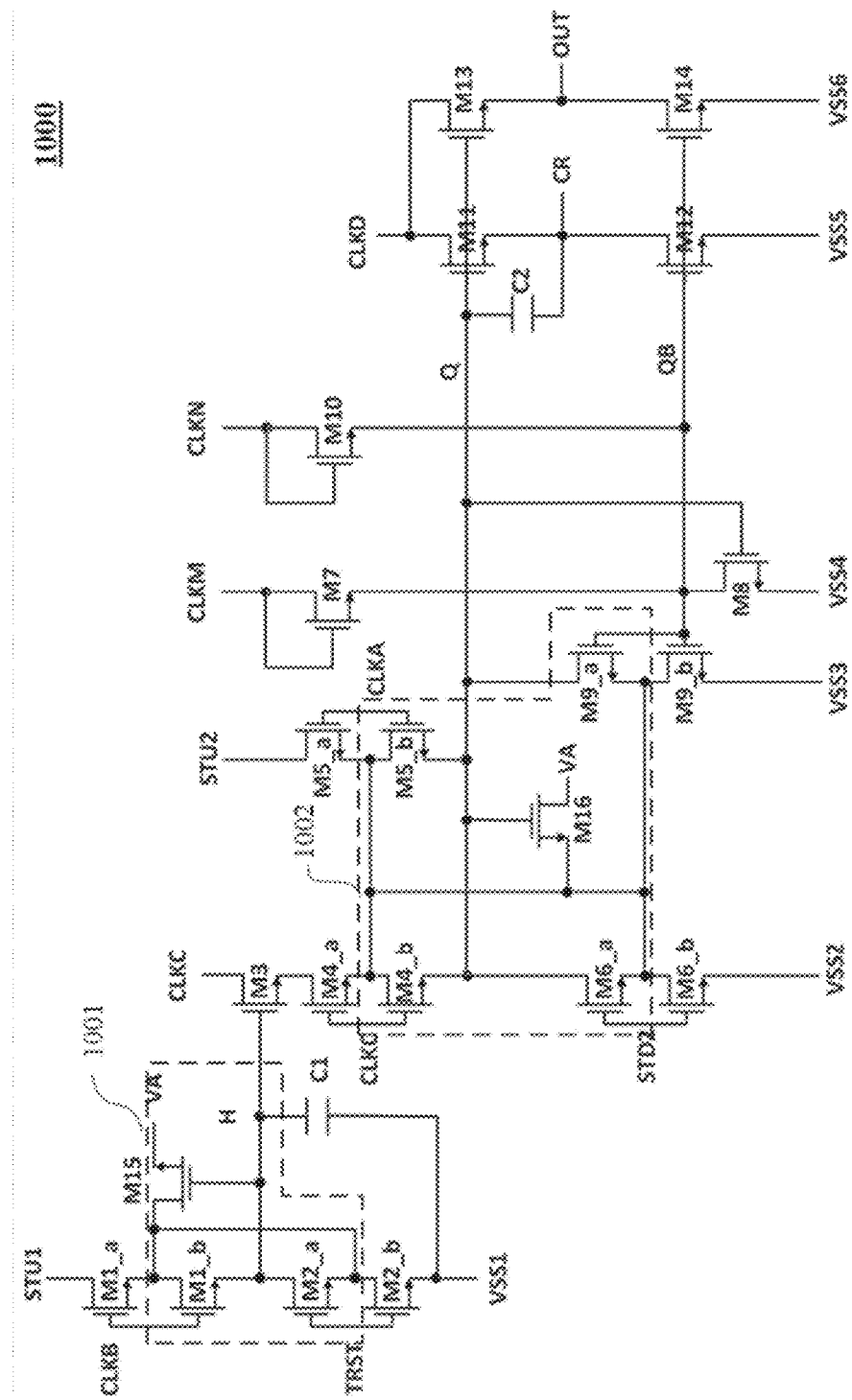
FIG. 10 shows a third exemplary circuit structure of a shift register according to some embodiments of the present disclosure.

FIG. 10 shows an exemplary circuit structure of a shift register according to some embodiments of the present disclosure. As described above, in the shift register provided in the present disclosure, the potential at the blanking pull-up control node H may be maintained by utilizing the first capacitor C1, and the potential at the first pull-up node Q is maintained by utilizing the output capacitor C2. If the potential at the first pull-up node Q and/or the blanking pull-up control node H is maintained at a high level, there are some transistors having a first electrode connected to the first pull-up node Q and/or the blanking pull-up control node H, and a second electrode connected to a low level signal line. Even if control electrodes of these transistors are inputted a turn-off signal, electric leakage is also likely to occur because a voltage difference exists between the two electrodes, so that the effect of maintaining the potential at the first pull-up node Q and/or the blanking pull-up control node H in the shift register becomes bad.

By taking the blanking pull-up control node H as an example, as shown in FIG. 6a, the first electrode of the charging transistor M1 is connected to the blanking input signal line STU1, and a second electrode of the charging transistor M1 is connected to the blanking pull-up control node H. If the blanking pull-up control node H is at a high level, the blanking input signal line is inputted a low level input signal, electric leakage is likely to occur to the charging transistor M1.

With respect to the above problem, a circuit structure of a shift register used for preventing electric leakage will be described below.

In a shift register 1000 shown in FIG. 10, a first electrode of a charging transistor M1_a is connected to the blanking input signal line STU1, a second electrode of the charging transistor M1_a is connected to an electric leakage prevention sub-circuit 1001, and a control electrode of the charging transistor M1_a is connected to the second clock signal line CLKB. A first electrode of an initialization reset transistor M12_b is connected to the electric leakage prevention sub-circuit 1001, a second electrode of the initialization reset transistor M12_b is connected to the first signal line VSS1, and a control electrode of the initialization reset transistor M12_b is connected to the initialization reset control terminal TRST.

As shown in FIG. 10, the shift register 1000 may comprise the electric leakage prevention sub-circuit 1001, configured to prevent charges at the blanking pull-up control node H from being leaked to the blanking input signal line STU1 via the charging transistor M1_a or from being leaked to the first signal line VSS1 via the initialization reset transistor M12_b, when the blanking pull-up control node H is at a high level, The electric leakage prevention sub-circuit 1001 may comprise a first electric leakage prevention transistor M1_b and a second electric leakage prevention transistor M15. Herein, a first electrode of the first electric leakage prevention transistor M1_b is connected to the blanking pull-up control node H, a second electrode of the first electric leakage prevention transistor M1_b is connected to the second electrode of the charging transistor M1_a, and a control electrode of the first electric leakage prevention transistor M1_b is connected to the control electrode of M1_a. A first electrode of the second electric leakage prevention transistor M15 is connected to the first electrode of the first electric leakage prevention transistor M1_b, a second electrode of the second electric leakage prevention transistor M15 is connected to an electric leakage prevention signal input terminal VA, and a control electrode of the second electric leakage prevention transistor M15 is connected to the blanking pull-up control node H. Herein, the electric leakage prevention signal input terminal VA may be inputted a high level signal. When the blanking pull-up control node H is at a high level, the second electric leakage prevention transistor M15 is turned on under control of the blanking pull-up control node H, and the high level signal inputted by the electric leakage prevention signal input terminal VA is inputted to the first electrode of the first electric leakage prevention transistor M1_b, so that both the first electrode and the second electrode of the electric leakage prevention transistor M1_b are in a state of high level, thereby preventing the charges at the blanking pull-up control node H from being leaked via the first electric leakage prevention transistor M1_b. At this time, since the control electrode of the charging transistor M1_a is connected to the control electrode of the M1_b, a combination of the electric leakage prevention transistor M1_b and the charging transistor M1_a may realize the effect as the same as the previous charging transistor, and at the same time has the effect of preventing electric leakage.

Similarly, the shift register 1000 may further comprise a third electric leakage prevention transistor M2_a, having a first electrode connected to the blanking pull-up control bode H, a second electrode connected to the first electrode of the initialization reset transistor M12_b, and a control electrode connected to the control electrode of the initialization reset transistor M12_b. Operation principles of the third electric leakage prevention transistor M2_a are the same as those of the first electric leakage prevention transistor M1_b, and may realize the effect of preventing the charges at the blanking pull-up control node H from being leaked to the low level signal terminal VSS1 via the initialization reset transistor M2_b.

Similarly, as for the input transistor M5_a, the second isolating transistor M4_a, the display reset transistor M6_b, and the first pull-down transistor M9_b connected to the first pull-up node Q, the electric leakage prevention sub-circuit having the same principles may be adopted to realize the effect of electric leakage prevention.

For example, the shift register 1000 may further comprise a second electric leakage prevention sub-circuit 1002. Herein, as for each transistor independently connected to the first pull-up node Q, the second electric leakage prevention sub-circuit 1002 may comprise transistors M4_b, M5_b, M9_a and M6_a used for preventing electric leakage, and their structures and principles are the same as the structures and principles of the first electric leakage prevention transistor M1_b and the third electric leakage prevention transistor M2_a as shown in the first electric leakage prevention sub-circuit 1001. For example, the second electric leakage sub-circuit 1002 may comprise a transistor M16, having a first electrode connected to one electrode of the transistors M4_b, M5_b, M9_a and M6_a used for preventing electric leakage, a second electrode connected to the electric leakage prevention signal input terminal VA, and a control electrode connected to the first pull-up node Q. Herein, the electric leakage prevention signal input terminal VA may be inputted a high level signal.

Those skilled in the art may understand that according to the embodiments of the principles of electric leakage prevention provided in the present disclosure, the structure of electric leakage prevention may be increased by selecting one or more transistors in the shift register circuit according to the actual situation. FIG. 10 only shows an exemplary circuit structure including the electric leakage prevention structure, but it does not form a limitation to the protection scope of the present disclosure.

Figure 11:
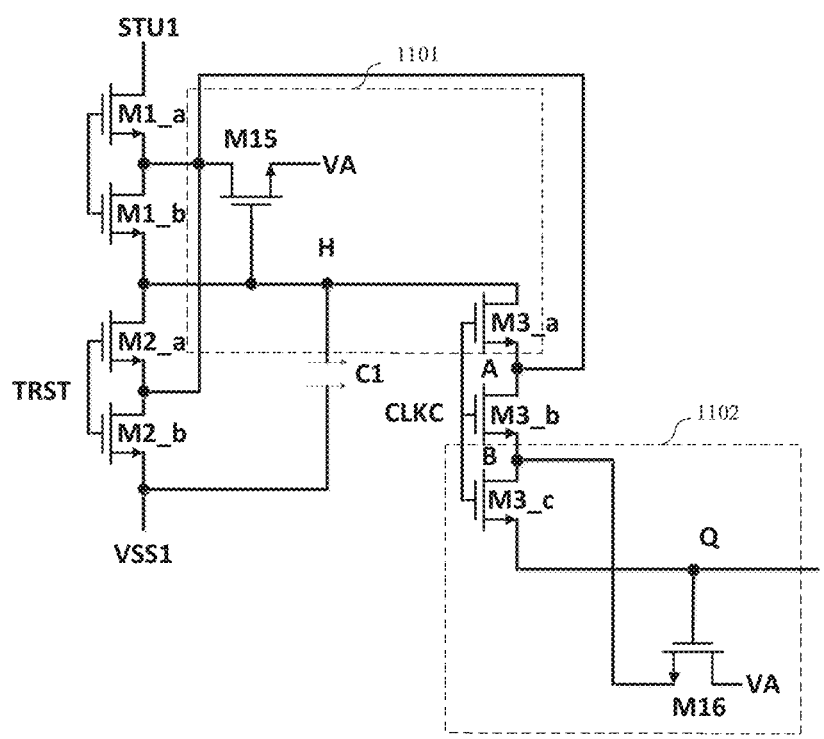
FIG. 11 shows a fourth exemplary circuit structure of a shift register according to some embodiments of the present disclosure.

FIG. 11 shows an exemplary circuit structure of a shift register according to some embodiments of the present disclosure. An isolating sub-circuit in a shift register 1100 as shown in FIG. 11 adopts the structure of the isolating sub-circuit as shown in FIG. 6f, wherein the first pull-up node Q and the blanking pull-up control node H are connected via the isolating transistor M3. Therefore, if the potentials of the first pull-up node Q and the blanking pull-up control node H are different (for example, one of the first pull-up node Q and the blanking pull-up control node H is at a high level, and another thereof is at a low level), electric leakage is likely to occur between the first pull-up node Q and the blanking pull-up control node H.

In order to prevent the first pull-up node Q and the blanking pull-up control node H from electric leakage, the exemplary circuit structure as shown in FIG. 11 may be adopted. As shown in FIG. 11, the shift register may comprise a first electric leakage prevention sub-circuit 1101 and a second electric leakage prevention sub-circuit 1102.

The first electric leakage prevention sub-circuit 1101 may comprise a first electric leakage prevention transistor M3_a and a second electric leakage prevention transistor M15. A first electrode of the first electric leakage prevention transistor M3_a is connected to the blanking pull-up control node H, a second electrode of the first electric leakage prevention transistor M3_a is connected to a first electrode of an isolating transistor M3_b, and a control electrode of the first electric leakage prevention transistor M3_a is connected to a control electrode of the isolating transistor M3_b. A first electrode of the second electric leakage prevention transistor M15 is connected to the electric leakage prevention signal input terminal VA, a second electrode of the second electric leakage prevention transistor M15 is connected to a second electrode of the first electric leakage prevention transistor M3_a, and a control electrode of the second electric leakage prevention transistor M15 is connected to the blanking pull-up control node H. Herein, if the blanking pull-up control node H is at a high level, the second electric leakage prevention transistor M15 may be turned on under control of the blanking pull-up control node H, and inputs the high level signal inputted by the electric leakage prevention signal input terminal VA to the second electrode of the first electric leakage prevention transistor M3_a (i.e., point A in FIG. 11).

By utilizing the first electric leakage prevention circuit 1101, it may be realized that the blanking pull-up control node H may be prevented from leaking electric to the first pull-up node Q via the isolating transistor M3 if the blanking pull-up control node H is at a high level.

The second electric leakage prevention sub-circuit 1102 may comprise a third electric leakage prevention transistor M3_c and a fourth electric leakage prevention transistor M16. Herein, a first electrode of the third electric leakage prevention transistor M3_c is connected to the first pull-up node Q, a second electrode of the third electric leakage prevention transistor M3_c is connected to a second electrode of the isolating transistor M3_b, and a control electrode of the third electric leakage prevention transistor M3_c is connected to a control electrode of the isolating transistor M3_b. A first electrode of the fourth electric leakage prevention transistor M16 is connected to the electric leakage prevention signal input signal VA, a second electrode of the fourth electric leakage prevention transistor M16 is connected to the second electrode of the third electric leakage prevention transistor M3_c, and a control electrode of the fourth electric leakage prevention transistor M16 is connected to the first pull-up node Q. Herein, if the first pull-up node Q is at a high level, the fourth electric leakage prevention transistor M16 may be turned on under the control of the first pull-up node Q, and input the high level signal inputted by the electric leakage prevention signal input terminal VA to the second electrode (i.e., point B in FIG. 11) of the third electric leakage prevention transistor M3_c.

By utilizing the second electric leakage sub-circuit 1102, it may be realized that the first pull-up node Q is prevented from leaking electric to the blanking pull-up control node H via the isolating transistor M3 when the first pull-up node Q is at a high level.

Therefore, by utilizing the structure of the electric leakage prevention sub-circuit provided in the embodiment of the present disclosure, the situation that electric leakage is likely to occur may be prevented when potentials of the first pull-up node Q and the blanking pull-up control node H are different.

Capacitance in the shift register described above may be either a capacitor or a coupling capacitance of the transistor.

Figure 12:
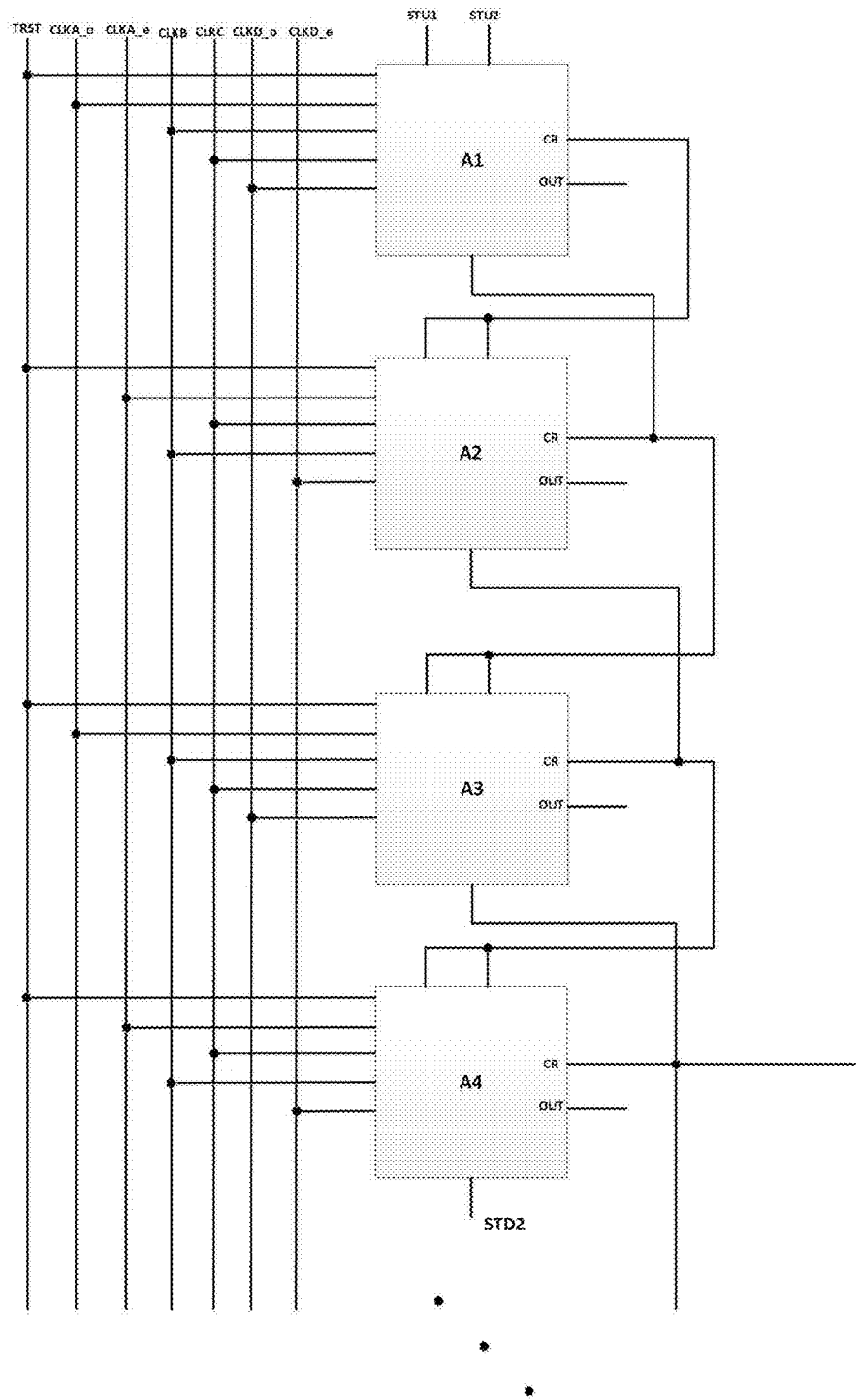
FIG. 12 shows a schematic block diagram of a gate driving circuit according to some embodiments of the present disclosure.

FIG. 12 shows a schematic block diagram of a gate driving circuit according to some embodiments of the present disclosure. As shown in FIG. 12, the gate driving circuit comprises a plurality of stages of shift registers connected cascades, of which any stage or several stages of shift registers may adopt structures or modifications of the shift register as shown in one of FIGS. 2-11.

According to the cascade structure of the shift register of the gate driving circuit as shown in FIG. 12, a display input terminal STU2 and a blanking input terminal STU1 of an i-th stage of shift register are connected to an output terminal CR of an (i−1)-th stage of shift register, and an output terminal CR of the i-th stage of shift register is connected to a display reset terminal STD2 of the (i−1)-th stage of shift register, where N is an integer greater than 2, $1<i\leq N$. A display input terminal STU2 of a first stage of shift register is connected to a display signal line, and a blanking input terminal of the first stage of shift register is connected to a blanking signal line; a display reset control terminal STD2 of an N-th stage of shift register is connected to a display reset signal line.

Each row of shift register is connected to the second clock signal line CLKB and the third clock signal line CLKC respectively. Each row of shift register may be further connected to the initialization reset signal line TRST. Herein, shift registers in odd-numbered rows are connected to a first clock signal line CLKA_o and a fourth clock signal line CLKD_o, and shift registers in even-numbered rows are connected to a first clock signal line CLKA_e and a fourth clock signal line CLKD_e respectively.

Figure 13:
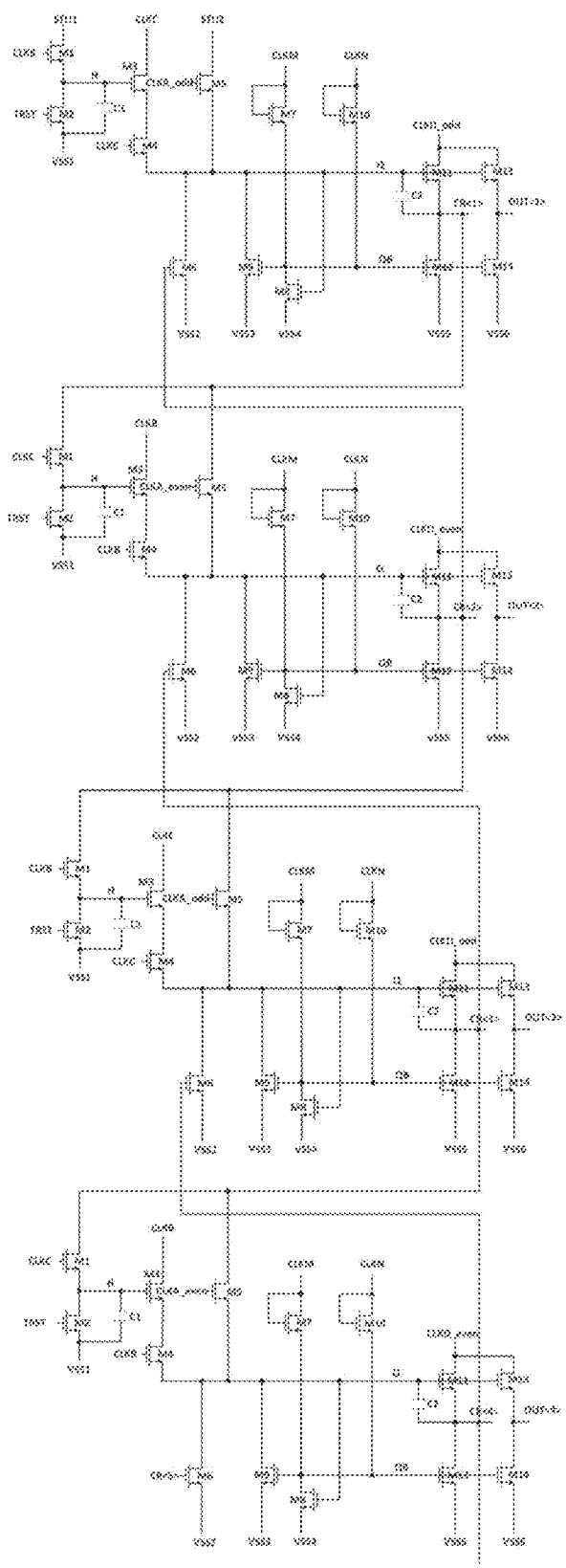
FIG. 13 shows an exemplary circuit structure of a gate driving circuit according to some embodiments of the present disclosure.

FIG. 13 shows an exemplary circuit structure of a gate driving circuit according to some embodiments of the present disclosure. A shift register connected in cascades in the gate driving circuit as shown in FIG. 13 may be replaced with a modification of any shift register described above, and thus no further details are given herein.

As shown in FIG. 13, a control terminal of a charging transistor in an odd-numbered row of shift register is connected to the second clock signal line CLKB, and a control terminal of a charging transistor in an even-numbered row of shift register is connected to the third clock signal line CLKC.

Figure 14A:
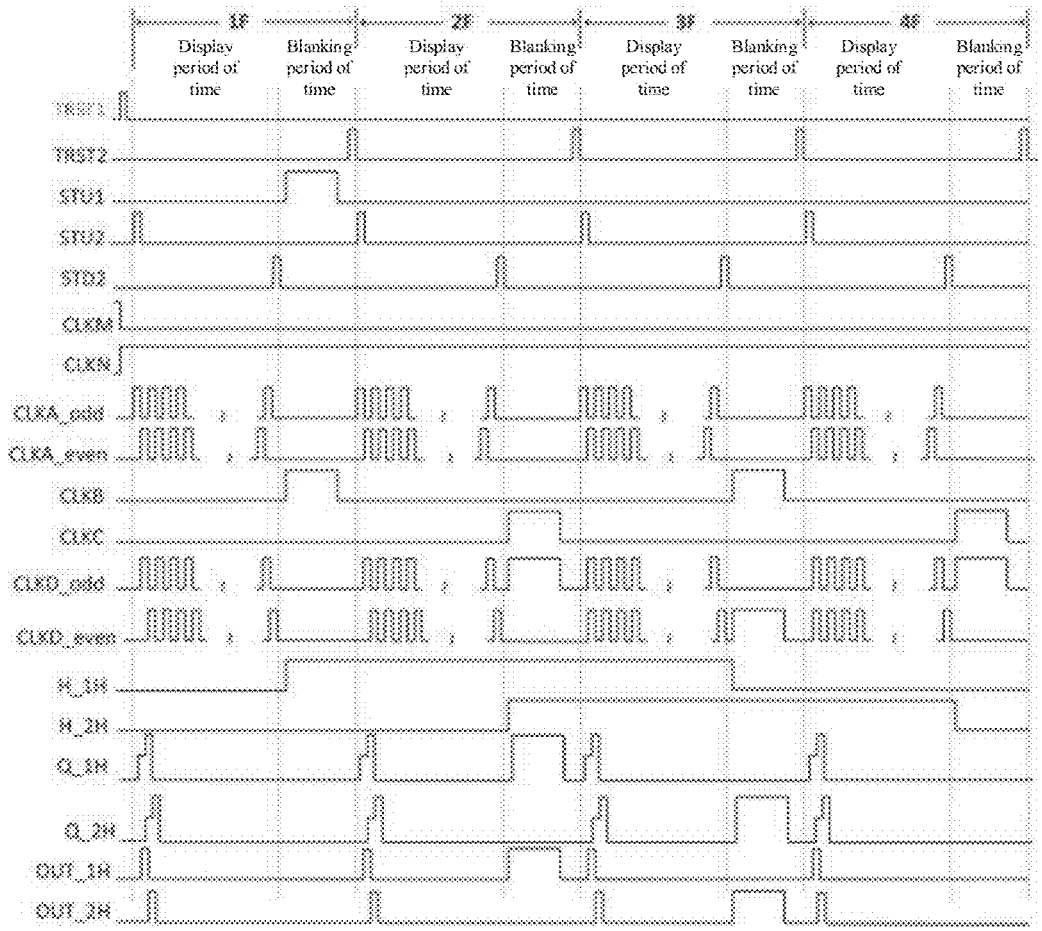
FIG. 14a shows a driving timing diagram of a gate driving circuit according to some embodiments of the present disclosure.

FIG. 14a shows a driving timing diagram of a gate driving circuit according to some embodiments of the present disclosure. The driving timing diagram as shown in FIG. 14a is applicable to the gate driving circuit as shown in FIGS. 12-13. By taking the shift register as shown in FIG. 8 as an example, a driving timing of the gate driving circuit formed by the plurality of stages of shift registers connected in cascades will be described below.

Herein, in the driving timing as shown in FIG. 14a, CLKA_odd represents a first clock signal line CLKA of the odd-numbered rows (for example, the first, third, fifth, . . . row) of shift register in the gate driving circuit, and CLKA_even represents a first clock signal line CLKA of the even-numbered rows (for example, the second, fourth, sixth, . . . row) of shift register in the gate driving circuit. Similarly CLKD_odd represents a fourth clock signal line CLKD of the odd-numbered rows (for example, the first, third, fifth, . . . row) of shift register in the gate driving circuit, and CLKD_even represents a fourth clock signal line CLKD of the even-numbered rows (for example, the second, fourth, sixth, . . . row) of shift register in the gate driving circuit. Q_1H represents a change in a potential at a first pull-up node Q in a first row of shift register in the gate driving circuit, and Q_2H represents a change in a potential at a first pull-up node Q in a second row of shift register in the gate driving circuit. OUT_1H represents a change in a potential at an output terminal OUT in the first row of shift register in the gate driving circuit, and OUT_2H represents a change in a potential at an output terminal OUT in the second row of shift register in the gate driving circuit.

STU1 and STU2 as shown in FIG. 14a represent a blanking input signal and a display input signal connected to the first row of shift register, respectively, and STD2 represents a display reset control signal connected to a last row of shift register.

As shown in FIG. 14a, before the shift register starts operating, one of the seventh clock signal line CLKM and the eighth clock signal line CLKM is inputted a turn-on signal of a high level, and another thereof is inputted a turn-off signal of a low level. Therefore, at this time, the pull-down node QB of respective rows of shift registers is maintained in a state of high level, and the first pull-up node Q is maintained in a state of low level. When the gate driving circuit starts operating, before a first frame is displayed, the gate driving circuit may receive the initialization reset control signal TRST1, and reset the blanking pull-up control node of respective shift registers in the gate driving circuit through the initialization reset sub-circuit.

Figures 14B, 14C:
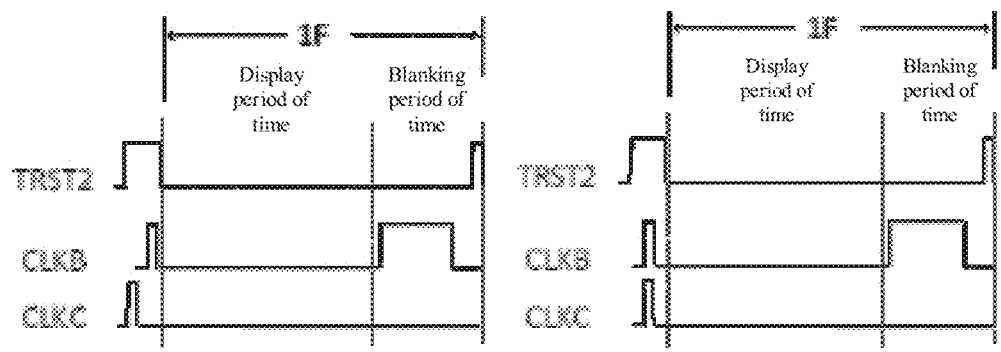
FIG. 14b shows a first driving timing diagram of a gate driving circuit according to some embodiments of the present disclosure.
FIG. 14c shows a second driving timing diagram of a gate driving circuit according to some embodiments of the present disclosure.

FIG. 14b shows another driving timing diagram for the initialization reset of the shift register according to the present disclosure. In some embodiments, the shift register may omit the initialization reset sub-circuit and the initialization reset signal line TRST1. At this time, the blanking pull-up control node H may be initially reset by utilizing the second clock signal line CLKB and the third clock signal line CLKC. For example, as shown in FIG. 14b, resetting the blanking pull-up control node H of each row of shift register may be realized by firstly inputting the second clock signal CLKB of a high level before the first frame is displayed, and then inputting the third clock signal CLKC of a high level. For another example, resetting the blanking pull-up control node H of each row of shift register may also be realized by firstly inputting the third clock signal CLKC of a high level before the first frame is displayed and then inputting the second clock signal CLKB of a high level. For another example, as shown in FIG. 14c, resetting the blanking pull-up control node H of each row of shift register may also be realized by inputting the second clock signal CLKB and the third clock signal CLKC at a high level simultaneously.

In some embodiments, if the shift register comprises a blanking reset sub-circuit (the blanking reset sub-circuit 470 as shown in FIG. 8), the first pull-up node Q may be reset by utilizing the blanking reset sub-circuit before the first frame is displayed. At this time, a high level signal may be inputted through the blanking reset control terminal TRST2. For example, as shown in FIGS. 14b and 14c, a blanking reset signal of a high level may be inputted at the same time when the second clock signal and the third clock signal of a high level are inputted as an initialization reset signal to realize resetting the blanking pull-up control node H, so as to realize the initialization reset of the first pull-up node Q. Herein, the high level signal inputted by TRST2 may cover the high level signals inputted by the second clock signal line CLKB and the third clock signal line CLKC. That is to say, a rising edge of the initialization reset signal inputted by TRST2 is earlier than rising edges of respective high level signals inputted by the second clock signal line CLKB and the third clock signal line CLKC, and a falling edge thereof is later than falling edges of respective high level signals inputted by the second clock signal line CLKB and the third clock signal line CLKC.

The circuit structure of the shift register may be further simplified by utilizing the driving method of the initialization reset.

Those skilled in the art may understand that the driving method of the shift register described below may apply the initialization reset driving method as shown in FIGS. 14b and 14c.

In a display phase of a first frame, the first row of shift register receives from its display input terminal STU2 a high level signal for an input for displaying. At this time, the display input sub-circuit may output a display pull-up signal to the first pull-up node Q according to a display input signal, and pulls up the potential of the first pull-up node Q to the high level. After that, the output sub-circuit receives a high level signal input from a fourth clock signal line CLKD_odd of the first row. At this time, since the output transistors M11 and M13 are turned on under control of the first pull-up node Q, the high level signal inputted by the fourth clock signal line CLKD may be outputted from the output terminals CR, OUT_1H as a display output signal via the output transistors M11 and M13.

Since the display output signal of the first row of shift register may be taken as the display input signal of the second row of shift register, the plurality of shift registers connected in cascades as shown in FIG. 13 would accomplish output of the display signals progressively. For example, as shown in FIG. 14a, the output terminal of the first row of shift register outputs a signal OUT_1H. Then, the output terminal of the second row of shift register outputs a signal OUT_2H, and so on and so forth, and no further details are given herein.

For the first row of shift register, its display reset control terminal is connected to an output terminal of the second row of shift register. Therefore, when the second row of shift register outputs a display output signal OUT_2H, the first pull-up node Q of the first row of shift register is reset to a low level.

By analogy, the first pull-up node Q of the subsequent respective row of shift registers is reset to the low level after the display output signal is outputted. The first pull-up node Q of the last row of shift register would be reset under control of the display reset control signal STD2.

By now, display period of time of the first frame ends up.

In a blanking phase of the first frame, the first row of shift register receives high level signals inputted by the blanking input terminal STU1 and the second clock signal line CLKB, and the second clock signal line CLKB is inputted a high level signal. Therefore, the charging transistor M1 is turned on, and pulls up the potential at the blanking pull-up control node H to the high level via the charging transistor M1. Due to existence of the first capacitor C1, the blanking pull-up control node H would be maintained in a state of high level.

Before the blanking phase of the first frame ends up, the shift registers may receive the blanking reset signal through the blanking reset signal line, so as to reset the potentials of the first pull-up nodes Q and/or the output terminals.

By now, driving timing of the first frame ends up.

In a display phase of a second frame, respective rows of shift registers repeat the driving timing of the shift register as the same as the display phase of the first frame, and output driving signals of the pixel circuits progressively. No further details are given herein.

In a blanking period of time of the second frame, as for the first row of shift register, the third clock signal line CLKC is inputted a high level signal. Since the blanking pull-up control node H is in a state of high level, the first isolating transistor M3 is turned on. Therefore, the potential of the first pull-up node Q may be pulled up to the high level by utilizing the high level signal inputted by the third clock signal line CLKC. At the same time, the fourth clock signal line CLKD outputs a high level signal. At this time, since the output transistor M3 is turned on under control of the first pull-up node Q, the high level signal inputted by the fourth clock signal line CLKD may be outputted as the blanking output signal via the output terminal.

As shown in FIGS. 12 and 13, the output terminal CR of the first row of shift register is connected to the blanking input terminal of the second row of shift register. Therefore, the blanking output signal of the first row of shift register may be taken as the blanking input signal of the second row of shift register, and the potential of the blanking pull-up control node H of the second row of shift register is pulled up to a high level.

Before the blanking phase of the second frame ends up, the shift registers may receive the blanking reset signal through the blanking reset signal line, so as to reset the potentials of the first pull-up nodes Q and/or the output terminals.

By now, driving timing of the second frame ends up.

In a display phase of a third frame, the driving timing of the shift registers in the display phase of the first frame is repeated, and the driving signals of the pixel circuits are outputted progressively. Herein, no further details are given.

In a blanking period of time of the third frame, the second clock signal line CLKB is inputted a high level clock signal, the second row of shift register repeats the driving timing of the first row of shift register in the blanking phase of the second frame, and output the blanking output signal from the second row of shift register. As described above, the blanking output signal outputted by the second row of shift register may be used for pulling up the potential of the blanking pull-up control node H of the third row of shift register to the high level.

As for the first row of shift register, the second clock signal line CLKB is inputted a high level clock signal at this time, and the charging transistor M2 is turned on under control of the high level clock signal. Furthermore, the blanking input terminal of the first row of shift register is inputted a low level signal at this time. Therefore, the charges stored in the first capacitor of the first row of shift register may be discharged via the charging transistor, and the potential of the blanking pull-up control node H is pulled down to the low level.

Before the third-frame blanking phase of the third frame ends up, the shift registers may receive the blanking reset signal through the blanking reset signal, so as to reset the potentials of the first pull-up nodes Q and/or the output terminals.

By now, driving timing of the third frame ends up.

As described above, in the display phase of each frame, the shift registers connected in cascades output corresponding driving signals progressively. Taking the second frame as a start, in blanking phase of each frame, the shift registers connected in cascades output the blanking output signals in sequence. For example, as described above, the first row of shift register outputs the blanking output signal used for the first row of pixel circuit unit in the blanking phase of the second frame, and the second row of shift register outputs a blanking output signal used for the second row of pixel circuit unit in the third-frame blanking phase of the third frame, and so on and so forth.

Figure 15:
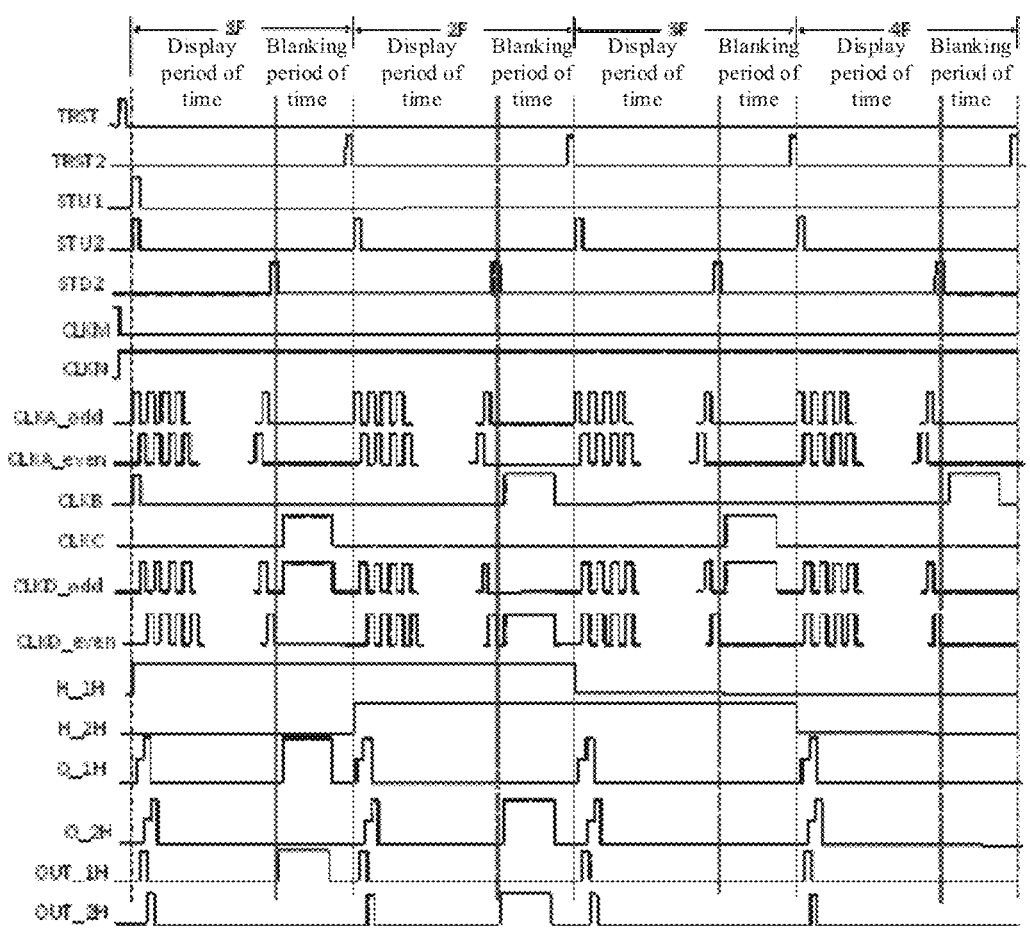
FIG. 15 shows a driving timing diagram of a gate driving circuit according to some embodiments of the present disclosure.

FIG. 15 shows a driving timing diagram of a gate driving circuit according to some embodiments of the present disclosure. In display phase of each frame, the shift registers connected in cascades output corresponding driving signals progressively. The driving timing in the display phase is the same as that as shown in FIG. 14a, and no further details are given herein.

In the driving timing as shown in FIG. 15, it is different from the driving timing as shown in FIG. 14a that in the driving timing as shown in FIG. 15, the blanking input terminal of the first row of shift register is inputted a blanking input signal of a high level in the display phase of the first frame, and at the same time, the third clock signal line CLKB is inputted a high level signal, so as to pull up the potential at the blanking pull-up control node H of the first row of shift register. In the blanking phase of the first frame, the third clock signal line CLKC is inputted a high level clock signal, and the second isolating transistor M4 is turned on under control of the high level signal inputted by the CLKC, and pulls up the potential of the first pull-up node Q of the first row of shift register to the high level. At the same time, the fourth clock signal line CLKD_odd of the first row of shift register is inputted a fourth clock signal of a high level, and outputs the fourth clock signal from the output terminal as a blanking output signal.

Taking the blanking phase of the first frame as a start, as shown in FIG. 15, the second clock signal line CLKB and the third clock signal line CLKC are inputted turn-on signals of high level in sequence, so as to control the respective rows of shift registers to output the blanking output signals in sequence.

As described above, the first row of shift register outputs the blanking output signal in the blanking phase of the first frame, and the second row of shift register outputs the blanking output signal in the blanking phase of the second-frame, and so on and so forth.

According to the gate driving circuit provided in the present disclosure, the shift register connected in cascades may realize outputting the display output signal in the display phase of a frame in sequence progressively. In the blanking period of time of a frame, the blanking output signal is outputted sequentially at a frequency of outputting one row of signals per frame. Herein, the display output signal and the blanking output signal of each row of shift register share one output transistor.

Figure 16:
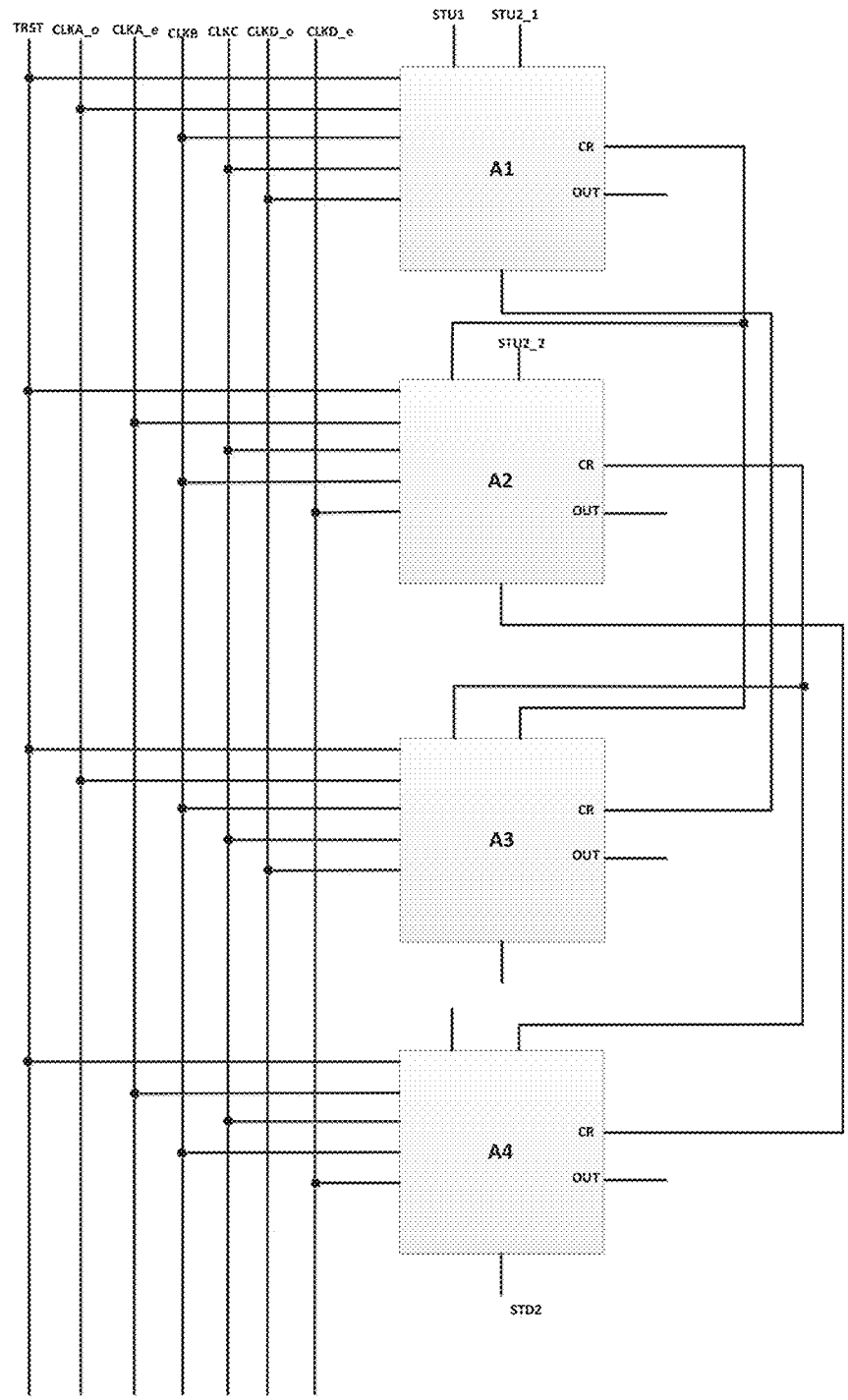
FIG. 16 shows another schematic block diagram of a gate driving circuit according to some embodiments of the present disclosure.

FIG. 16 shows a schematic block diagram of a gate driving circuit according to some embodiments of the present disclosure. As shown in FIG. 16, the figure only shows previous 4 stages of the N stages of shift registers connected in cascades. As for 2<i<N-1, a blanking input terminal of an i-th row of shift register is connected to an output terminal of an (i−1)-th row of shift register, a display input terminal of the i-th row of shift register is connected to an output terminal of an (i−2)-th row of shift register, and a display reset terminal of the i-th row of shift register is connected to an output terminal of an (i+2)-th row of shift register. At the same time, a blanking input terminal and a display input terminal of a first row of shift register are connected to a blanking input signal line and a first display input signal line respectively, a display input terminal of a second row of shift register is connected to a second display input signal line, and a display reset terminal of a (N−1)-th row of shift register is connected to a first display reset signal line, and a display reset terminal of a N-th row of shift register is connected to the first display reset signal line.

Each row of shift register is connected to the second clock signal line CLKB and the third clock signal line CLKC respectively. Each row of shift register may be further connected to the initialization reset signal terminal TRST. Herein, the odd-numbered rows of shift registers are connected to the first clock signal line CLKA_o and the fourth clock signal line CLKD_o, and the even-numbered rows of shift registers are connected to the first clock signal line CLKA_e and the fourth clock signal line CLKD_e.

Figure 17:
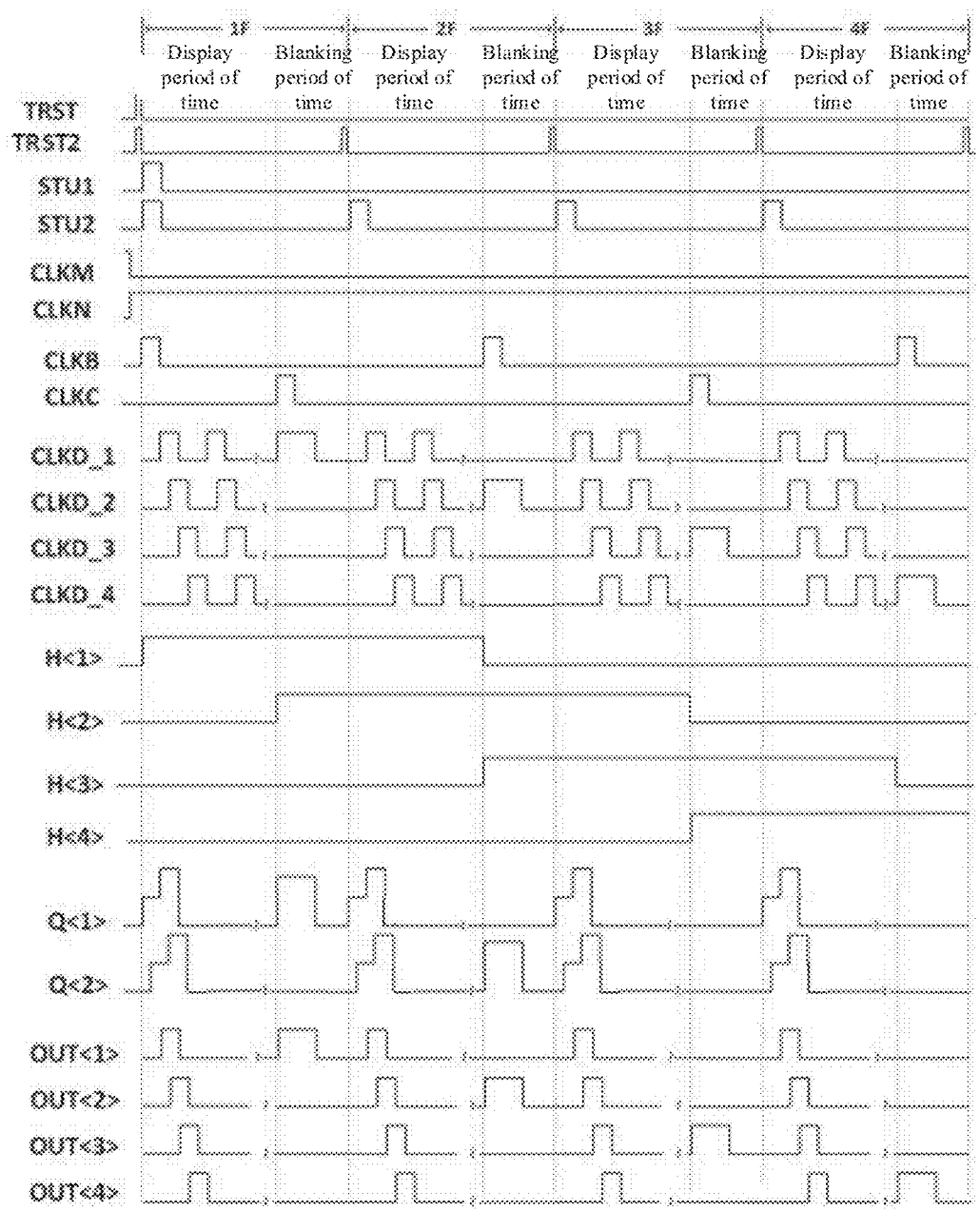
FIG. 17 shows a driving timing diagram of a gate driving circuit according to some embodiments of the present disclosure.

FIG. 17 shows a driving timing diagram of a gate driving circuit according to some embodiments of the present disclosure. The driving timing as shown in FIG. 17 may be applied to the gate driving circuit as shown in FIG. 16.

In the timing diagram as shown in FIG. 17, CLKD_1, CLKD_2, CLKD_3, CLKD_4 represent a fourth clock signal line of a first, second, third, fourth row of shift register respectively. Q<1>, Q<2> represent changes in the potentials at the first pull-up node Q in the first, second row of shift register. OUT<1>, OUT<2>, OUT<3>, OUT<4> represent changes in the potentials at the output terminals CR and OUT in the first, second, third, fourth row of shift register respectively.

As shown in FIG. 17, before the shift register starts operating, one of the seventh clock signal line CLKM and the eighth clock signal line CLKM is inputted a turn-on signal of a high level, and another thereof is inputted a turn-off signal of a low level. Therefore, the pull-down node QB is maintained in a state of high level at this time, and the first pull-up node Q is maintained in a state of low level. When the gate driving circuit starts operating, before the first frame is displayed, the gate driving circuit may receive the initialization reset control signal TRST, and resets the blanking pull-up control node H of each shift register in the gate driving circuit through the initialization reset sub-circuit as described above.

In the display phase of the first frame, the first row of shift register receives from the display input terminal STU2 a high level signal for input for displaying. At this time, the display input sub-circuit may output the display pull-up signal to the first pull-up node Q according to the display input signal, and pulls up the potential of the first pull-up node Q to the high level. After that, the output sub-circuit receives a high level signal input from a fourth clock signal line CLKD_1 of a first row. At this time, since the output transistors M11 and M13 are turned on under control of the first pull-up node Q, the high level signal inputted by the fourth clock signal line CLKD may be outputted from the output terminals CR and OUT_1H as the display output signal via the output transistors M11 and M13.

As for the second row of shift register, it may receive from a second display input signal line STU2_2 a high level signal for an input for displaying. At this time, the display input sub-circuit of the second row of shift register may output the display pull-up signal to the first pull-up node Q according to the display input signal, and pulls up the potential of the first pull-up node Q to the high level. After that, the output sub-circuit of the second row of shift register receives a high level signal input from the fourth clock signal line CLKD_2. At this time, since the output transistors M11 and M13 are turned on under control of the first pull-up node Q, the high level signal inputted by the fourth clock signal line CLKD_2 may be outputted from the output terminals CR, OUT_1H as the display output signal via the output transistors M11, and M13.

As shown in FIG. 17, a clock signal inputted by the fourth clock signal line CLKD_2 connected to the second row of shift register has a clock width the same as a clock signal inputted by the fourth clock signal line CLKD_2 connected to the first row of shift register, while a rising edge of the clock signal inputted by the fourth clock signal line connected to the second row of shift register is later by a width of half a clock signal than a rising edge of the clock signal inputted by the fourth clock signal CLKD_1 connected to the first row of shift register. Correspondingly, the display input signal outputted by the second row of shift register is also later by a width of half a clock signal than the display input signal outputted by the first row of shift register. At this time, 50% pulse overlap exists between the display output signal of the first row of shift register and the display output signal of the second row of shift register.

Since the display output signal of the first row of shift register may be taken as the display input signal of the third row of shift register, the odd-numbered stages of shift registers of the plurality of shift registers connected in cascades as shown in FIG. 16 would accomplish the output of the display signal according to the display output signal of the first row of shift register progressively. Similarly, the even-numbered stages of shift registers of the plurality of shift registers connected cascades as shown in FIG. 16 would complete the output of the display signal according to the display output signal of the first row of shift register progressively, and so on and so forth, and thus no further details are given herein.

Shift registers having overlapped outputs may be realized through the gate driving circuit provided in the embodiments of the present disclosure.

As for a blanking output signal, as shown in FIG. 16, since the connection modes of the blanking output terminals of the plurality of shift registers connected in cascades as shown in the figure are the same as the connection modes of the blanking output terminals of the plurality of shift registers connected in cascades as shown in FIGS. 12 and 13, the driving mode of the gate driving circuit as shown in FIG. 16 in the blanking phase is the same as the driving mode of the gate driving circuit in the blanking phase as shown in FIGS. 12 and 13, and thus no further details are given herein.

According to the gate driving circuit as shown in FIG. 16 and the driving timing as shown as shown in FIG. 17, it may be realized that display output signals having 50% overlap are outputted between the adjacent shift registers. Those skilled in the art may understand that by utilizing the principles provided in the present disclosure, display output signals having other overlap proportions may be realized.

For example, the N rows of shift registers connected in cascades may be divided into a plurality of shift register sets. For example, the gate driving circuit comprises m sets, wherein each set comprises n shift registers as described above.

As for the blanking input signal, a progressively cascade connection mode is adopted between the blanking input signal terminals of the N rows of shift registers connected in cascades. That is to say, the output terminal of the first row of shift register is connected to the blanking input terminal of the second row of shift register, and the output terminal of the second row of shift register is connected to the blanking input terminal of the third row of shift register, and so on and so forth.

As for the display input signal, n shift registers in each set of shift register sets and n shift registers in a next set of shift register set adopt a row-by-row connection mode, respectively. That is to say, an output terminal of a first shift register in a first set of shift register is connected to a display input terminal of a first shift register in a second set of shift register set(i.e., a (n+1)-th row of the N-th row of shift registers), and an output terminal of a second shift register in the first set of shift register set is connected to a display input terminal of a second shift register in the second set of shift register set (i.e., a (n+2)-th row of the N-th row of shift registers), and so on and so forth.

The display output signal of each row of shift register in the gate driving circuit as described above and the display output signal of a next row of shift register would have an overlap of a part of 1/n pulse.

For example, the display output signal of the gate driving circuit as shown in FIG. 16 adopts the connection mode of odd-numbered rows being connected in cascades and even-numbered rows being connected in cascades, so as to realize display output signal having 50% overlap. If the mode of the first, fourth, seventh, ... rows connected in cascades, the second, fifth, eighth, ... rows connected in cascades, and the third, sixth, ninth, ... rows connected in cascades, a display output signal having 33% overlap would be realized. Those skilled in the art may select a connection mode of the gate driving circuit according to the actual condition, so as to realize outputting display output signals having different overlap proportions between adjacent shift registers.

Figure 18:
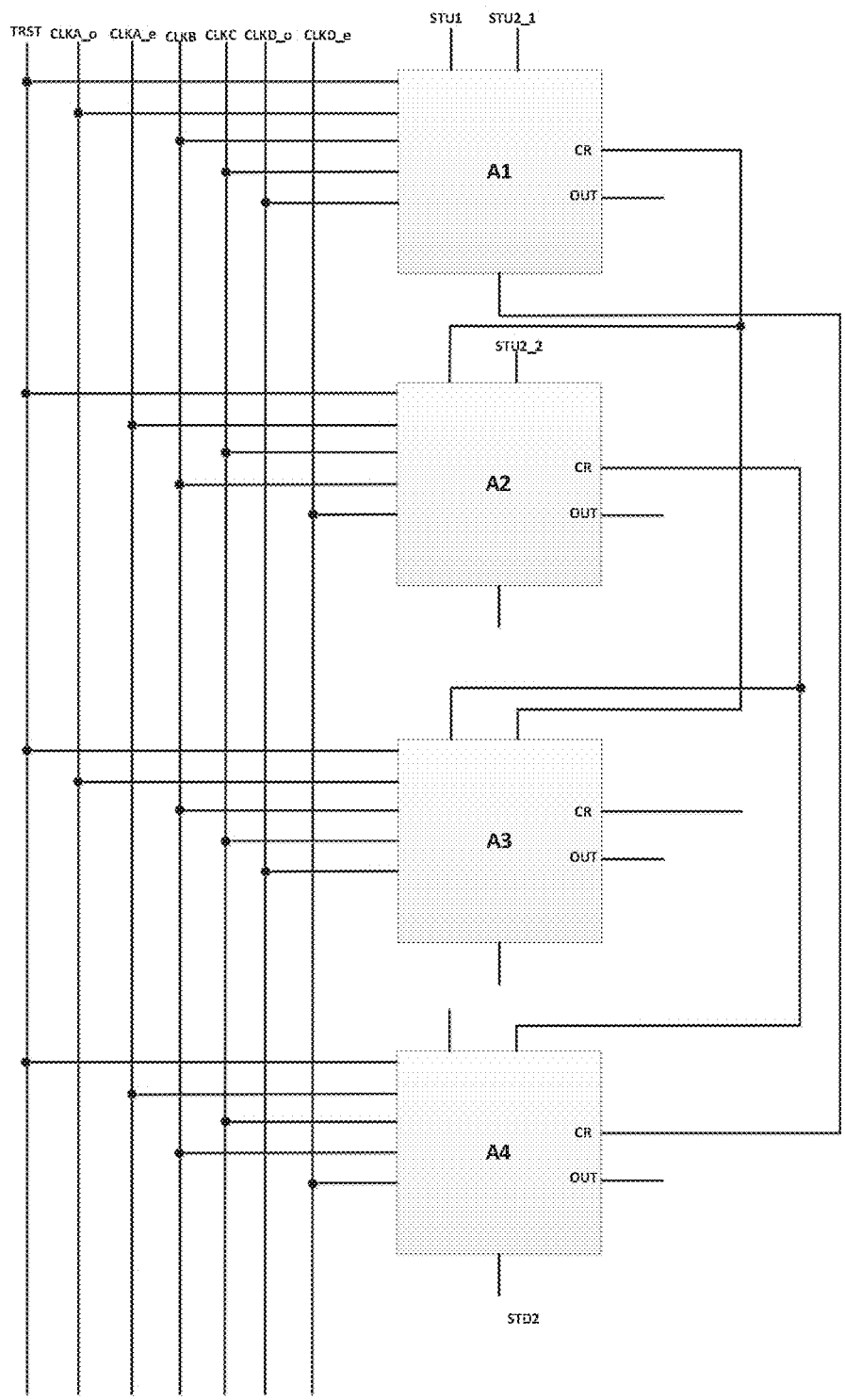
FIG. 18 shows another schematic block diagram of a gate driving circuit according to some embodiments of the present disclosure.

FIG. 18 shows a schematic block diagram of a gate driving circuit according to some embodiments of the present disclosure. As shown in FIG. 18, only four previous stages of the N stages of shift registers connected in cascades are shown in the figure, where N is a positive integer. As for 2<i<N-2, a blanking input terminal of an i-th row of shift register is connected to an output terminal of an (i−1)-th row of shift register, a display input terminal of the i-th row of shift register is connected to an output terminal of an (i−2)-th row of shift register, and a display reset terminal of the i-th row of shift register is connected to an output terminal of an (i+3)-th row of shift register. At the same time, a blanking input terminal and a display input terminal of a first row of shift register are connected to a blanking input signal line and a first display input signal line respectively, and a display input terminal of a second row of shift register is connected to a second display input signal line, and a display reset terminal of an (N-2)-th row of shift register is connected to a first display reset signal line, and a display reset terminal of an (N-1)-th row of shift register is connected to a second display reset signal line. A display reset terminal of the N-th row of shift register is connected to a third display reset signal line.

Each row of shift register is connected to the second clock signal line CLKB and the third clock signal CLKC. Each row of shift register may be further connected to the initialization reset signal line TRST. Herein, the odd-numbered rows of shift registers are connected to the first clock signal line CLKA_o and the fourth clock signal line CLKD_o respectively, and the even-numbered rows of shift registers are connected to the first clock signal line CLKA_e and the fourth clock signal line CLKD_e.

The gate driving circuit as shown in FIG. 18 differs from the gate driving circuit as shown in FIG. 16 in that the output terminal of the i-th row of shift register in FIG. 16 is connected to the display input terminal of the (i+2)-th row of shift register, and the output terminal of the (i+2)-th row of shift register is connected to the display reset control terminal of the i-th row of shift register.

Figure 19:
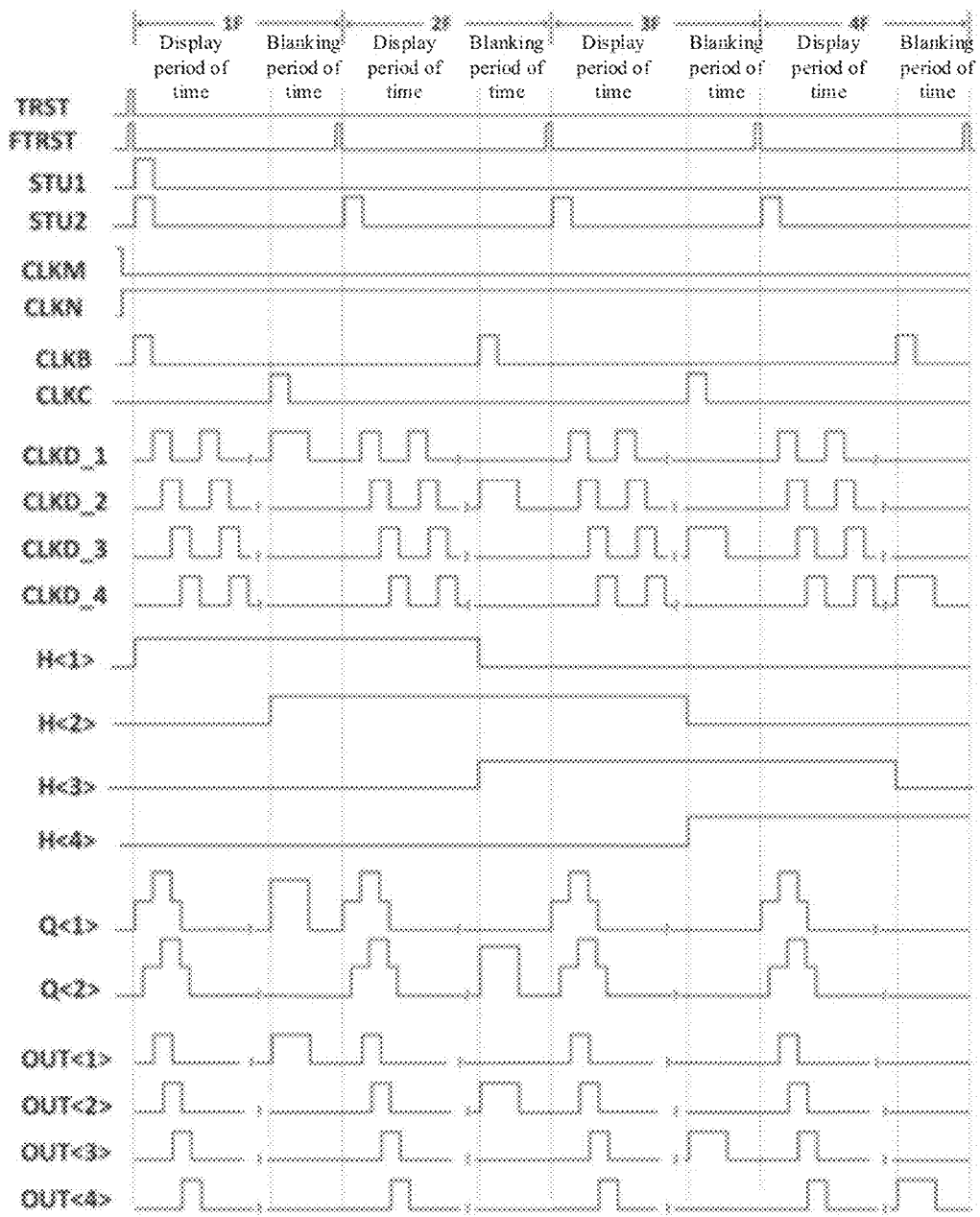
FIG. 19 shows a driving timing diagram of a gate driving circuit according to some embodiments of the present disclosure.

FIG. 19 shows a driving timing diagram of a gate driving circuit according to some embodiments of the present disclosure. The driving timing as shown in FIG. 19 may be applied to the gate driving circuit as shown in FIG. 18.

As described above, the gate driving circuit as shown in FIG. 18 differs from the gate driving circuit as shown in FIG.

16 only in that connections modes of the display reset control terminal are different. Therefore, the driving timing of the display input and the driving timing of the blanking input of respective rows of shift registers among the driving timings as shown in FIG. 19 are the same as the driving timing as shown in FIG. 17, and thus no further details are given herein.

As for the display reset phase, according to the gate driving circuit and its driving method provided in FIGS. 18 and 19, since the display reset terminal of the first row of shift register is connected to the output terminal of the fourth row of shift register, as shown in FIG. 19, the potential of the first pull-up node Q is maintained at a high level after the first row of shift register outputs the display output signal. Since the fourth clock signal line CLKD_1 is at a low level at this time, charges accumulated at the output terminal OUT would be discharged to the fourth clock signal line CLKD_1 via the output transistor.

Since the output terminal OUT outputs a driving signal for driving the pixel circuit, in order to enhance the driving capability of the shift register, in the shift register of the related art, the output transistor M13 would adopt a transistor having a relatively large size. Correspondingly, in the shift register adopted in the gate driving circuit as shown in FIG. 16, in the display reset phase, charges accumulated at the output terminal OUT may be reset through the display reset transistor M14_a. The display reset transistor M14_a herein also needs to adopt a transistor having a relatively large size.

However, in the gate driving circuit according to some embodiments of the present disclosure, since the charges accumulated at the output terminal OUT may be discharged via the output transistor M13, without resetting by utilizing the display reset transistor, the display reset transistor M14_a may use a smaller transistor at this time, so as to further reduce the size of the shift register. In addition, when the output terminal of the output sub-circuit is at a high level, the potential at the first pull-up node Q rises due to the bootstrapping effect. Therefore, when the output terminal is discharged, the current flowing through the output transistor M13 would become larger, and the discharging speed would become faster.

Figure 20:
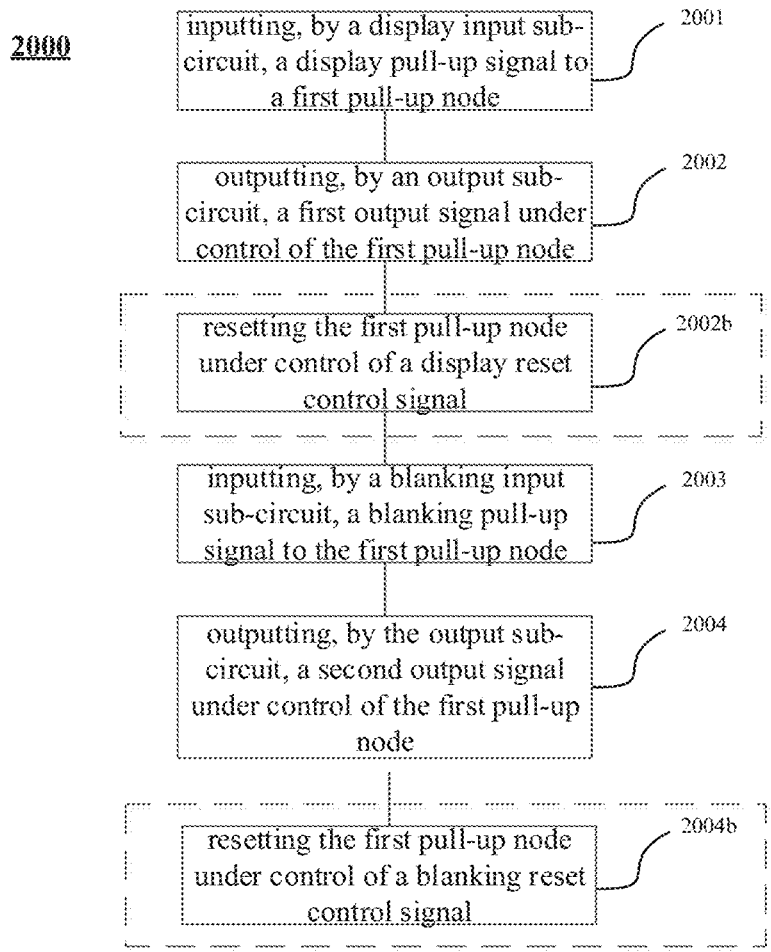
FIG. 20 shows a flow chart of a driving method for the shift register as described above according to some embodiments of the present disclosure.

FIG. 20 shows a flow chart of a driving method for the shift register as described above according to some embodiments of the present disclosure. As shown in FIG. 20, a driving method 2000 may comprise a step 2001, in a first control phase, inputting, by a display input sub-circuit, a display pull-up signal to a first pull-up node; a step 2002, in a first output phase, outputting, by an output sub-circuit, a first output signal under control of the first pull-up node; step 2003, in a second control phase, inputting, by a blanking input sub-circuit, a blanking pull-up signal to the first pull-up node; and step 2004, in a second output phase, outputting, by an output sub-circuit, a second output signal under control of the first pull-up node.

In some embodiments, the driving method 2000 may further comprise a step 2002b, in a display reset phase, resetting the first pull-up node under control of the display reset control signal.

In some embodiments, the driving method 2000 may further comprise a step 2004b, in a blanking reset phase, resetting the first pull-up node under control of the blanking reset control signal.

In the driving method for the shift register according to some embodiments of the present disclosure, the blanking input sub-circuit used for controlling the output sub-circuit to output the blanking output signal in the blanking period of time and the display input sub-circuit used for controlling the output sub-circuit to output the display output signal in the display period of time may share the same pull-up node Q and the same output sub-circuit, so as to realize a shift register structure having a smaller size.

Unless otherwise defined, all terms (including technical and scientific terms) used herein have the meanings as the same as those meanings commonly understood by those ordinary skilled in the art. It shall be further understood that those terms such as defined in general dictionaries shall be explained as having meanings consistent with meanings in the context of related technology, but shall not be explained by idealized or formalized meanings, unless otherwise explicitly defined.

The above are descriptions of the present disclosure, but shall not be considered as limitations to the present disclosure. Although several exemplary embodiments of the present disclosure are described, it is easy for those skilled in the art to understand that various amendments may be made to the exemplary embodiments without departing from novel teachings and advantages of the present disclosure. Therefore, all these amendments intend to be included within the scope of the present disclosure as defined in the Claims. It shall be understood that the above are the descriptions of the present disclosure, but shall not be considered as being limited to specific disclosed embodiments. Furthermore, amendments made to the embodiments and other embodiments of the present disclosure shall intend to be included within the scope of the Claims. The present disclosure is defined by the Claims and equivalents thereof.

What is claimed is:

1. A shift register, comprising:
a first input sub-circuit, configured to receive a first input signal from a first input terminal and output a blanking output control signal;
a second input sub-circuit, configured to receive a second input signal from a second input terminal and output a display output control signal;
an output sub-circuit, configured to output a composite output signal via an output terminal under control of a first node, the composite output signal including a display output signal outputted in a display period of time and a blanking output signal outputted in a blanking period of time which are independent of each other;
a pull-down control sub-circuit, configured to control a potential of a pull-down node according to the first node; and
a pull-down sub-circuit, configured to pull down the first node and the output terminal to a non-operating potential under control of the pull-down node,
wherein
the pull-down control sub-circuit comprises a first pull-down control transistor and a second pull-down control transistor, wherein a first electrode of the first pull-down control transistor is connected with a control electrode of the first pull-down control transistor and connected to a pull-down control signal line, and a second electrode of the first pull-down control transistor is connected to the pull-down node, a first electrode of the second pull-down control transistor is connected to the pull-down node, a control electrode of the second pull-down control transistor is connected to the first node, and a second electrode of the second pull-down control transistor is connected to a pull-down signal line,
the pull-down sub-circuit comprises a first pull-down transistor and a second pull-down transistor, wherein a first electrode of the first pull-down transistor is connected to the first node, a control electrode of the first pull-down transistor is connected to the pull-down node, and a second electrode of the first pull-down transistor is connected to the pull-down signal line, a first electrode of the second pull-down transistor is connected to the output terminal, a control electrode of the second pull-down transistor is connected to the pull-down node, and a second electrode of the second pull-down transistor is connected to the pull-down signal line, the first input sub-circuit comprises:
- a charging sub-circuit, configured to input the first input signal to a blanking pull-up control node according to the first input signal;
- a storing sub-circuit, having a first terminal connected to the blanking pull-up control node, configures to store a blanking pull-up control signal according to the first input signal; and
- an isolating sub-circuit, configured to input the blanking output control signal to the first node according to the blanking pull-up control signal in the blanking period of time of a frame;

the isolating sub-circuit comprises a first isolating transistor and a second isolating transistor, wherein a control electrode of the first isolating transistor is connected to the blanking pull-up control node, a first electrode of the second isolating transistor is connected to a second electrode of the first isolating transistor, a second electrode of the second isolating transistor is connected to the first node, and a control electrode of the second isolating transistor is connected to an isolation control signal line, the shift register further comprising:
an electric leakage prevention sub-circuit, configured to input an operating potential to the first electrode or the second electrode of the second isolating transistor under control of the first node and/or the blanking pull-up control node, wherein the electric leakage prevention sub-circuit comprises a transistor configured for preventing electric leakage, wherein a control electrode of the transistor is connected to the control electrode of the second isolating transistor, a first electrode of the transistor is connected to the second electrode of the second isolation transistor, and a second electrode of the transistor is connected to the first node.

2. The shift register according to claim 1, wherein the first input sub-circuit is configured to receive the first input signal from the first input terminal, and input the blanking output control signal to the first node in a blanking period of time of the frame according to the first input signal, and the second input sub-circuit is configured to receive the second input signal from the second input terminal, and input the display output control signal to the first node in a display period of the frame according to the second input signal.

3. The shift register according to claim 1, further comprising:
a display reset sub-circuit, configured to reset the first node under control of a display reset control signal.

4. The shift register according to claim 3, further comprising:
a blanking reset sub-circuit, configured to reset the first node and/or the output terminal under control of a blanking reset control signal before an end of the blanking period of time of the frame.

5. The shift register according to claim 1, wherein the output sub-circuit comprises at least one shift signal output terminal and at least one pixel signal output terminal.

6. The shift register according to claim 1, wherein
the charging sub-circuit comprises a charging transistor, having a first electrode and/or a control electrode connected to the first input terminal, and a second electrode connected to the blanking pull-up control node; and
the storing sub-circuit comprises a first capacitor, having a first terminal connected to the blanking pull-up control node.

7. The shift register according to claim 6, wherein the electric leakage prevention sub-circuit comprises a second electric leakage prevention transistor, wherein a first electrode of the second electric leakage prevention transistor is connected to the second electrode of the charging transistor, a second electrode of the second electric leakage prevention transistor is connected to an electric leakage prevention signal input terminal, and a control electrode of the second electric leakage prevention transistor is connected to the blanking pull-up control node.

8. The shift register according to claim 1, wherein
the second input sub-circuit comprises a first display input transistor, having a first electrode connected to the first node, a second electrode and/or a control electrode connected to the second input terminal; and
the output sub-circuit comprises an output transistor and an output capacitor, wherein a first electrode of the output transistor is connected to an output clock signal line, a second electrode of the output transistor is connected to the output terminal, and a control electrode of the output transistor is connected to the first node, a first terminal of the output capacitor is connected to the first node, and a second terminal of the output capacitor is connected to the output terminal.

9. The shift register according to claim 8, wherein the second input sub-circuit further comprises a second display input transistor, having a first electrode and a gate electrode both connected to the first electrode of the first display input transistor, and a second electrode connected to the first node.

10. The shift register according to claim 3, wherein
the display reset sub-circuit comprises a display reset transistor, having a first electrode connected to the first node, a control electrode connected to a display reset control terminal, and a second electrode connected to a display reset signal line.

11. The shift register according to claim 1, wherein the electric leakage prevention sub-circuit comprises a transistor configured for preventing electric leakage, wherein a control electrode of the transistor is connected to the control electrode of the second isolating transistor, a first electrode of the transistor is connected to another transistor configured for preventing electric leakage, and a second electrode of the transistor is connected to the second isolating transistor.

12. The shift register according to claim 1, wherein the electric leakage prevention sub-circuit comprises a transistor configured for preventing electric leakage, wherein a control electrode of the transistor is connected to the pull-down node, a first electrode of the transistor is connected to the first node, and a second electrode of the transistor is connected to a third signal line.

13. The shift register according to claim 1, wherein the electric leakage prevention sub-circuit comprises a transistor configured for preventing electric leakage, wherein a control electrode of the transistor is connected to a display reset control terminal, a first electrode of the transistor is connected to the first node, and a second electrode of the transistor is connected to a second signal line.

14. A gate driving circuit, comprising N stages of shift registers, where N is an integer greater than 2, each of the shift registers being the shift register according to claim 1, a second input terminal of a first stage shift register is connected to a display signal line, and a first input terminal of the first stage shift register is connected to a blanking signal line; and a display reset control terminal of an N-th stage shift register is connected to a display reset signal line.

15. A display apparatus, comprising the gate driving circuit according to claim 14.

16. A driving method applicable to the shift register according to claim 1, comprising:

during a display period of time of the frame:
in a first control phase, inputting, by the second input sub-circuit, the display output control signal to the first node; and
in a first output phase, outputting, by the output sub-circuit, a first output signal under control of the first node, and during the blanking period of time of the frame:
in a second control phase, inputting, by the first input sub-circuit, the blanking output control signal to the first node; and
in a second output phase, outputting, by the output sub-circuit, a second output signal under control of the first node.

17. The driving method according to claim 16, further comprising:

in a display reset phase, resetting the first node under control of a display reset control signal.

* * * * *